US012755798B2

(12) United States Patent
Tseng et al.

(10) Patent No.: US 12,755,798 B2
(45) Date of Patent: Oct. 6, 2026

(54) MEMORY DEVICE WITH IN-MEMORY SEARCHING (IMS) CELLS AND METHOD OF EUCLIDEAN DISTANCE IMS CELL ENCODING

(71) Applicant: MACRONIX INTERNATIONAL CO., LTD., Hsinchu (TW)

(72) Inventors: Po-Hao Tseng, Taichung City (TW); Shao-Yu Fang, New Taipei City (TW); Feng-Min Lee, Hsinchu City (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 151 days.

(21) Appl. No.: 18/760,123

(22) Filed: Jul. 1, 2024

(65) Prior Publication Data

US 2026/0004854 A1 Jan. 1, 2026

(51) Int. Cl.

| | |
|---|---|
| ***G11C 16/10*** | (2006.01) |
| ***G11C 11/54*** | (2006.01) |
| ***G11C 15/04*** | (2006.01) |
| ***G11C 16/08*** | (2006.01) |
| ***G11C 16/26*** | (2006.01) |
| *G11C 16/04* | (2006.01) |

(52) U.S. Cl.

CPC .............. *G11C 16/26* (2013.01); *G11C 11/54* (2013.01); *G11C 15/04* (2013.01); *G11C 16/08* (2013.01); *G11C 16/0483* (2013.01)

(58) Field of Classification Search

CPC ..... G11C 16/26; G11C 16/0483; G11C 16/08; G11C 13/0069; G11C 13/0004; G11C 13/0002; G11C 15/04; G11C 1/54; G06F 9/3893; H03M 1/462

See application file for complete search history.

(56) References Cited

U.S. PATENT DOCUMENTS

| | | | | |
|---|---|---|---|---|
| 6,449,188 B1 * | 9/2002 | Fastow | .............. | G11C 16/0416 365/185.17 |
| 2018/0322922 A1 * | 11/2018 | De Santis | .......... | G11C 16/0483 |
| 2020/0192971 A1 * | 6/2020 | Lue | .......................... | G06F 17/16 |
| 2022/0284964 A1 * | 9/2022 | Wang | ..................... | H10B 41/27 |

(Continued)

FOREIGN PATENT DOCUMENTS

| | | | |
|---|---|---|---|
| CN | 110892480 | A | 3/2020 |
| TW | I827143 | B | 12/2023 |

(Continued)

*Primary Examiner* — Mushfique Siddique

(74) *Attorney, Agent, or Firm* — McClure, Qualey & Rodack, LLP

(57) ABSTRACT

A memory device includes first and second memory strings. The first memory string includes a first switch element and generates a first cell current signal. The second memory string comprising a second switch element and configured to generate a second cell current signal. The first and second switch elements operate as a first memory cell storing a first store bit, control terminals of the first and second switch elements receive first and second word line signals, respectively, the first and second word line signals carries a first input bit, and a summation of a current value of the first cell current signal and a current value of the second cell current signal is proportional to a square of a difference between a logic value of the first store bit and a logic value of the first input bit.

9 Claims, 14 Drawing Sheets

(56) References Cited

U.S. PATENT DOCUMENTS

| | | | | |
|---|---|---|---|---|
| 2022/0398439 | A1* | 12/2022 | Zhang | G06F 7/523 |
| 2023/0036141 | A1* | 2/2023 | Tseng | G11C 16/26 |
| 2023/0061496 | A1* | 3/2023 | Tseng | G11C 15/046 |
| 2023/0075257 | A1* | 3/2023 | Lee | G11C 7/1069 |
| 2023/0197155 | A1* | 6/2023 | Tseng | G11C 7/16<br>365/49.17 |
| 2023/0368841 | A1* | 11/2023 | Lue | G11C 16/0483 |

FOREIGN PATENT DOCUMENTS

| | | | |
|---|---|---|---|
| TW | 202403757 | A | 1/2024 |
| WO | 2023033987 | A1 | 3/2023 |

* cited by examiner

MEMORY DEVICE WITH IN-MEMORY SEARCHING (IMS) CELLS AND METHOD OF EUCLIDEAN DISTANCE IMS CELL ENCODING

BACKGROUND

Technical Field

The present disclosure relates to a memory technique. More particularly, the present disclosure relates to a memory device and a memory system.

Description of Related Art

The Euclidean distance is the shortest distance between two points in the Euclidean space, and can be used as a common metric to measure the similarity between two data points. The Euclidean distance is also used in various fields such as geometry, data mining, deep learning and others. Thus, techniques associated with the designing for calculating the Euclidean distance are important issues in the field.

SUMMARY

The present disclosure provides a memory device. The memory device includes a first memory string and a second memory string. The first memory string includes a first switch element and configured to generate a first cell current signal. The second memory string comprising a second switch element and configured to generate a second cell current signal. The first switch element and the second switch element are configured to operate as a first memory cell storing a first store bit, a control terminal of the first switch element and a control terminal of the second switch element are configured to receive a first word line signal and a second word line signal, respectively, the first word line signal and the second word line signal are configured to carry a first input bit, and a summation of a current value of the first cell current signal and a current value of the second cell current signal is proportional to a square of a difference between a logic value of the first store bit and a logic value of the first input bit.

In some embodiments, when the first store bit has a first logic value, the first switch element has a first threshold voltage level, when the first store bit has a second logic value, the first switch element has a second threshold voltage level, when the first input bit has the first logic value, the first word line signal has a first voltage level, when the first input bit has the second logic value, the first word line signal has a second voltage level, and a difference between the first threshold voltage level and the second threshold voltage level is equal to a difference between the first voltage level and the second voltage level.

In some embodiments, when the first store bit has the first logic value, the first switch element has a third threshold voltage level, when the first store bit has the second logic value, the first switch element has a fourth threshold voltage level, when the first input bit has the first logic value, the first word line signal has a third voltage level, when the first input bit has the second logic value, the first word line signal has a fourth voltage level, and a difference between the third threshold voltage level and the fourth threshold voltage level is equal to a difference between the third voltage level and the fourth voltage level.

In some embodiments, the difference between the third threshold voltage level and the fourth threshold voltage level is equal to the difference between the first threshold voltage level and the second threshold voltage level.

In some embodiments, when the first store bit has a third logic value, the first switch element and the second switch element have the third threshold voltage level and the first threshold voltage level, respectively, and a difference between the first threshold voltage level and the third threshold voltage level is equal to the difference between the first threshold voltage level and the second threshold voltage level multiplied by a difference between the first logic value and the third logic value.

In some embodiments, when the first input bit has the third logic value, the first word line signal and the second word line signal have the third voltage level and the first voltage level, respectively.

In some embodiments, when the first store bit and the first input bit have the first logic value and the second logic value, respectively, the second cell current signal has a first current value, when the first store bit and the first input bit have the first logic value and the third logic value, respectively, the second cell current signal has a second current value, the second current value is equal to the first current value multiplied by a square of the difference between the first logic value and the third logic value.

In some embodiments, when the first store bit and the first input bit have the third logic value and the first logic value, respectively, the first cell current signal has the second current value.

In some embodiments, when each of the first store bit and the first input bit has the first logic value, each of the first cell current signal and the second cell current signal has a first current value, when the first store bit and the first input bit have the first logic value and the second logic value, respectively, the first cell current signal and the second cell current signal have the first current value and a second current value, respectively, and the second current value is larger than the first current value.

In some embodiments, when the first store bit and the first input bit have the first logic value and a third logic value, respectively, the first cell current signal and the second cell current signal have the first current value and a third current value, respectively, the third current value is equal to the first current value multiplied by four, and a difference between the first logic value and the second logic value is equal to a difference between the second logic value and the third logic value.

In some embodiments, when the first store bit and the first input bit have the first logic value and a fourth logic value, respectively, the first cell current signal and the second cell current signal have the first current value and a fourth current value, respectively, the third current value is equal to the first current value multiplied by nine, and a difference between the third logic value and the fourth logic value is equal to a difference between the second logic value and the third logic value.

The present disclosure provides a memory device. The memory device includes a plurality of memory strings configured to generate a plurality of cell current signals, and comprising a plurality of first memory cells. The plurality of first memory cells are configured to store a plurality of first store bits and are configured to receive a plurality of first word line signals, the plurality of first word line signals are configured to carry a plurality of first input bits, the plurality of first memory cells are further configured to compare the plurality of first store bits and the plurality of first input bits, to generate the plurality of cell current signals, the plurality of cell current signals flow through the plurality of memory strings, respectively, and are summed at a node to generate a bit line signal, and when the plurality of first memory cells performs a first search operation, a current value of the bit line signal is proportional to a square of an Euclidean distance between a data point corresponding to the plurality of first store bits and a data point corresponding to the plurality of first input bits.

In some embodiments, the plurality of memory strings further comprise a plurality of second memory cells, the plurality of second memory cells are memory cells are configured to store a plurality of second store bits and are configured to receive a plurality of second word line signals, the plurality of second word line signals are configured to carry a plurality of second input bits, the plurality of second memory cells are further configured to compare the plurality of second store bits and the plurality of second input bits, to generate the plurality of cell current signals, and when the plurality of second memory cells performs a second search operation, the current value of the bit line signal is proportional to a square of an Euclidean distance between a data point corresponding to the plurality of second store bits and a data point corresponding to the plurality of second input bits.

In some embodiments, each of the plurality of memory strings is configured to receive a reference voltage signal, the plurality of second memory cells are coupled between the reference voltage signal and the plurality of first memory cells, when the first search operation is performed, the bit line signal has a first voltage level, and when the second search operation is performed, the bit line signal has a second voltage level larger than the first voltage level.

In some embodiments, the plurality of memory strings further comprise a plurality of third memory cells, the plurality of third memory cells are memory cells are configured to store a plurality of third store bits and are configured to receive a plurality of third word line signals, the plurality of third word line signals are configured to carry a plurality of third input bits, the plurality of third memory cells are further configured to compare the plurality of third store bits and the plurality of third input bits, to generate the plurality of cell current signals, and when the plurality of third memory cells performs a third search operation, the current value of the bit line signal is proportional to a square of an Euclidean distance between a data point corresponding to the plurality of third store bits and a data point corresponding to the plurality of third input bits.

In some embodiments, each of the plurality of memory strings is configured to receive a reference voltage signal, the plurality of second memory cells are coupled between the reference voltage signal and the plurality of first memory cells, the plurality of third memory cells are coupled between the reference voltage signal and the plurality of second memory cells, when the first search operation is performed, the bit line signal has a first voltage level, when the second search operation is performed, the bit line signal has a second voltage level larger than the first voltage level, and when the third search operation is performed, the bit line signal has a third voltage level larger than the second voltage level.

In some embodiments, when the first search operation is performed, each of the plurality of second word line signals has a pass voltage level, and when the second search operation is performed, each of the plurality of first word line signals has the pass voltage level.

The present disclosure provides a memory system. The memory system includes a plurality of memory blocks and a sensing device. The plurality of memory blocks are configured to receive a plurality of string select line signals, respectively. The sensing device is configured to receive a plurality of string select line signals, respectively. The plurality of memory blocks comprises a plurality of first memory strings, the plurality of first memory strings comprises a first memory cell group configured to store a plurality of first store bits, the plurality of first memory strings are configured to compare the plurality of first store bits and a plurality of input bits, to generate a first bit line signal of the plurality of bit line signals, and a current value of the first bit line signal is proportional to a square of an Euclidean distance between a data point corresponding to the plurality of first store bits and a data point corresponding to the plurality of input bits.

In some embodiments, the plurality of memory blocks further comprises a plurality of second memory strings, the plurality of second memory strings comprises a second memory cell group configured to store a plurality of second store bits, the plurality of second memory strings are configured to compare the plurality of second store bits and the plurality of input bits, to generate a second bit line signal of the plurality of bit line signals, and a current value of the second bit line signal is proportional to a square of an Euclidean distance between a data point corresponding to the plurality of second store bits and the data point corresponding to the plurality of input bits.

In some embodiments, a quantity of the plurality of first store bits is an half of a quantity of the plurality of memory blocks.

It is to be understood that both the foregoing general description and the following detailed description are examples, and are intended to provide further explanation of the disclosure as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
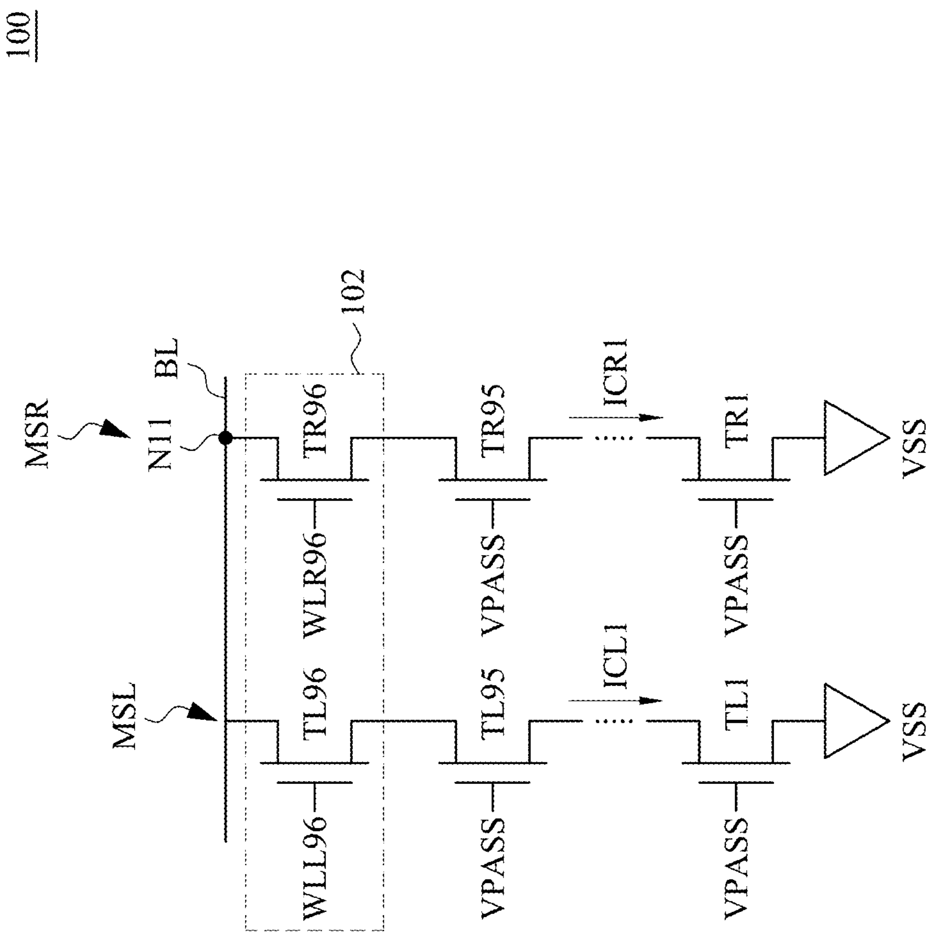
FIG. 1 is a schematic diagram of a part of a memory device illustrated according to some embodiments of present disclosure.

In the present disclosure, when an element is referred to as "connected" or "coupled", it may mean "electrically connected" or "electrically coupled". "Connected" or "coupled" can also be used to indicate that two or more components operate or interact with each other. In addition, although the terms "first", "second", and the like are used in the present disclosure to describe different elements, the terms are used only to distinguish the elements or operations described in the same technical terms. The use of the term is not intended to be a limitation of the present disclosure.

Unless otherwise defined, all terms (including technical and scientific terms) used in the present disclosure have the same meaning as commonly understood by the ordinary skilled person to which the concept of the present invention belongs. It will be further understood that terms (such as those defined in commonly used dictionaries) should be interpreted as having a meaning consistent with its meaning in the related technology and/or the context of this specification and not it should be interpreted in an idealized or overly formal sense, unless it is clearly defined as such in this article.

The terms used in the present disclosure are only used for the purpose of describing specific embodiments and are not intended to limit the embodiments. As used in the present disclosure, the singular forms "a", "one" and "the" are also intended to include plural forms, unless the context clearly indicates otherwise. It will be further understood that when used in this specification, the terms "comprises (comprising)" and/or "includes (including)" designate the existence of stated features, steps, operations, elements and/or components, but the existence or addition of one or more other features, steps, operations, elements, components, and/or groups thereof are not excluded.

Hereinafter multiple embodiments of the present disclosure will be disclosed with schema, as clearly stated, the details in many practices it will be explained in the following description. It should be appreciated, however, that the details in these practices is not applied to limit the present disclosure. Also, it is to say, in some embodiments of the present disclosure, the details in these practices are non-essential. In addition, for the sake of simplifying schema, some known usual structures and element in the drawings by a manner of simply illustrating for it.

FIG. 1 is a schematic diagram of a part of a memory device 100 illustrated according to some embodiments of present disclosure. In some embodiments, the memory device 100 includes memory strings MSL and MSR. The memory string MSR includes switch elements TR1-TR96. The memory string MSR includes switch elements TR1-TR96. The memory string MSL includes switch elements TL1-TL96. However, the embodiments of present disclosure are not limited to this. In various embodiments, the memory string can include various quantities of switch elements, that is, 96 can be substituted by other positive integers. In various embodiments, the switch elements TR1-TR96 and TL1-TL96 can be implemented by N-type metal-oxide-semiconductor (NMOS) transistors, and can also be implemented by P-type metal-oxide-semiconductor (PMOS) transistors.

As shown in FIG. 1, the switch elements TR1-TR96 are coupled in series with each other, and the switch elements TL1-TL96 are coupled in series with each other. A terminal of the switch element TL96 is coupled to a node N11, and another terminal of the switch element TL96 is coupled to a terminal of the switch element TL95. Another terminal of the switch element TL95 is coupled to a terminal of the switch element TL94, and so on. A terminal of the switch element TL1 is coupled to a terminal of the switch element TL2, and another terminal of the switch element TL1 is configured to receive a reference voltage signal VSS. Control terminals of the switch elements TL1-TL96 are configured to receive word line signals WLL1-WLL96, respectively. In some embodiments, the control terminals are referred to as gate terminals.

Similarly, a terminal of the switch element TR96 is coupled to the node N11, and another terminal of the switch element TR96 is coupled to a terminal of the switch element TR95. Another terminal of the switch element TR95 is coupled to a terminal of the switch element TR94, and so on. A terminal of the switch element TR1 is coupled to a terminal of the switch element TR2, and another terminal of the switch element TR1 is configured to receive the reference voltage signal VSS. Control terminals of the switch elements TR1-TR96 are configured to receive word line signals WLR1-WLR96, respectively.

In some embodiments, the switch elements TL96 and TR96 are configured to operate as a memory cell 102. The switch elements TL96 and TR96 correspond to left cell and right cell of the memory cell 102, respectively. The memory cell 102 is configured to store one store bit DT1.

On the other hand, the word line signals WLL96 and WLR96 are configured to carry one input bit SB1. The memory cell 102 is configured to compare the input bit SB1 and the store bit DT1 to generate a cell current signal ICL1 following through the memory string MSL and a cell current signal ICR1 following through the memory string MSR. The memory device 100 is configured to sum the cell current signals ICL1 and ICR1 at the node N11 to generate a bit line signal BL. As shown in FIG. 1, when the memory cell 102 performing the comparing operation described above, each of the word line signals WLL1-WLL95 and WLR1-WLR95 has a pass voltage level VPASS, such that each of the switch elements TL1-TL95 and TR1-TR95 is turned on.

In some embodiments, the memory cells in the memory device can be referred to as in-memory searching (IMS) cells. The IMS cells can be implemented by floating gate memory, split-gate memory, silicon-oxide-nitride-oxide-silicon (SONOS) memory, floating dot memory, dynamic random-access memory (DRAM) and/or other devices similar with DRAM. In some embodiments, the memory cell can also be implemented by emerging memory, such as ferroelectric field-effect transistor (FeFET). In various embodiments, the memory system can be implemented by 2D flash structure or 3D flash structure.

Figure 2:
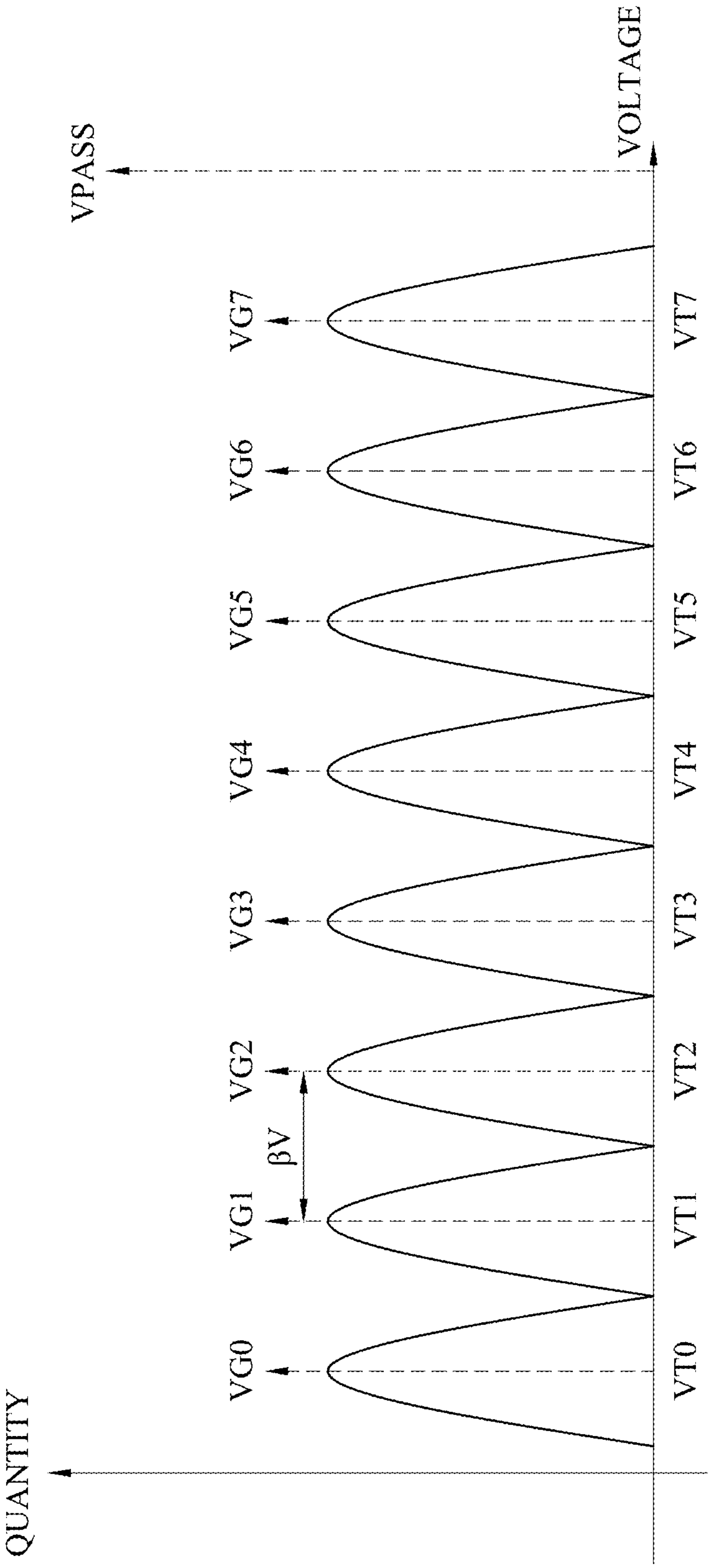
FIG. 2 is a schematic diagram of distributions of memory cells of the memory device illustrated according to some embodiments of present disclosure.

FIG. 2 is a schematic diagram of distributions of memory cells of the memory device 100 illustrated according to some embodiments of present disclosure. In FIG. 2, a horizontal axis of corresponds to voltage, and a vertical axis corresponds quantities of memory cells.

As shown in FIG. 2, the memory cells can have the distributions corresponding to threshold voltage levels VT0-VT7. The threshold voltage levels VT0-VT7 are arranged in order along the horizontal axis. Referring to FIG. 1 and FIG. 2, in response to a logic value of the store bit DT1, each of the switch elements TL96 and TR96 can have one of the threshold voltage levels VT0-VT7.

For example, when the store bit DT1 has a logic value 0, the switch elements TL96 and TR96 have the threshold voltage levels VT0 and VT7, respectively. When the store bit DT1 has a logic value 1, the switch elements TL96 and TR96 have the threshold voltage levels VT1 and VT6, respectively. When the store bit DT1 has a logic value 2, the switch elements TL96 and TR96 have the threshold voltage levels VT2 and VT5, respectively. When the store bit DT1 has a logic value 3, the switch elements TL96 and TR96 have the threshold voltage levels VT3 and VT4, respectively. When the store bit DT1 has a logic value 4, the switch elements TL96 and TR96 have the threshold voltage levels VT4 and VT3, respectively. When the store bit DT1 has a logic value 5, the switch elements TL96 and TR96 have the threshold voltage levels VT5 and VT2, respectively. When the store bit DT1 has a logic value 6, the switch elements TL96 and TR96 have the threshold voltage levels VT6 and VT1, respectively. When the store bit DT1 has a logic value 7, the switch elements TL96 and TR96 have the threshold voltage levels VT7 and VT0, respectively. As a result, the store bit DT1 can have 8 levels of logic values.

In some embodiments, in response to the store bit DT1 has n levels of logic values, for the logic values 0 to n−1 of the store bit DT1, the switch element TL96 has the threshold voltage levels VT0 to VT(n−1), and the switch element TR96 has the threshold voltage levels VT(n−1) to VT0. In which n is a positive integer.

In some embodiments, the word line signals can have voltage levels VG0-VG7 corresponding to the threshold voltage levels VT0-VT7 or the pass voltage level VPASS. As shown in FIG. 2, the voltage levels VG0-VG7 are arranged in order along the horizontal axis, and are located at the peaks of the distributions of the threshold voltage levels VT0-VT7, respectively. The pass voltage level VPASS is larger than the voltage levels VG0-VG7 and the threshold voltage levels VT0-VT7. Referring to FIG. 1 and FIG. 2, in response to a logic value of the input bit SB1, each of the word line signals WLL96 and WLR96 can have one of the voltage levels VG0-VG7. In some embodiments, the voltage levels VG0-VG7 are referred to as search voltage bias levels.

For example, when the input bit SB1 has the logic value 0, the word line signals WLL96 and WLR96 have the voltage levels VG0 and VG7, respectively. When the input bit SB1 has the logic value 1, the word line signals WLL96 and WLR96 have the voltage levels VG1 and VG6, respectively. When the input bit SB1 has the logic value 2, the word line signals WLL96 and WLR96 have the voltage levels VG2 and VG5, respectively. When the input bit SB1 has the logic value 3, the word line signals WLL96 and WLR96 have the voltage levels VG3 and VG4, respectively. When the input bit SB1 has the logic value 4, the word line signals WLL96 and WLR96 have the voltage levels VG4 and VG3, respectively. When the input bit SB1 has the logic value 5, the word line signals WLL96 and WLR96 have the voltage levels VG5 and VG2, respectively. When the input bit SB1 has the logic value 6, the word line signals WLL96 and WLR96 have the voltage levels VG6 and VG1, respectively. When the input bit SB1 has the logic value 7, the word line signals WLL96 and WLR96 have the voltage levels VG7 and VG0, respectively. As a result, the input bit SB1 can have 8 levels of logic values.

In some embodiments, in response to the input bit SB1 has n levels of logic values, for the logic values 0 to n−1 of the input bit SB1, the word line signal WLL96 has the voltage levels VG0 to VG(n−1), and the word line signal WLR96 has the voltage levels VG(n−1) to VG0.

In some embodiments, for any positive integer n, a difference between the threshold voltage levels VT(n) and VT(n−1) is a constant, and is equal to a difference between the voltage levels VG(n) and VG(n−1). As shown in FIG. 2, each of the difference between the threshold voltage levels VT(n) and VT(n−1) and the difference between the voltage levels VG(n) and VG(n−1) is equal to $\beta$ volt (V).

For example, in the embodiment with $\beta$ being 0.2, the difference between the threshold voltage levels VT(n) and VT(n−1) is 0.2 volt. Correspondingly, the difference between the voltage levels VG(n) and VG(n−1) is designed to be 0.2 volt. In various embodiments, $\beta$ can be any value.

In some embodiments, a current value of a cell current signal flowing through a switch element is proportional to a square of a difference between a threshold voltage level of a switch element and a voltage level applied to a control terminal of the switch element. It is noted that when the threshold voltage level is smaller than or equal to the voltage level applied to a control terminal of the switch element, the current value of the cell current signal is equal to zero.

For example, referring to FIG. 1, a current value of the cell current signal ICL1 is proportional to square of a difference between a threshold voltage level of the switch element TL96 and a voltage level of the word line signal WLL96. When the threshold voltage level of the switch element TL96 is smaller than or equal to the voltage level of the word line signal WLL96, the current value of the cell current signal ICL1 is equal to zero.

Similarly, a current value of the cell current signal ICR1 is proportional to square of a difference between a threshold voltage level of the switch element TR96 and a voltage level of the word line signal WLR96. When the threshold voltage level of the switch element TR96 is smaller than or equal to the voltage level of the word line signal WLR96, the current value of the cell current signal ICR1 is equal to zero. Further details of the cell current signal are described below with the embodiments associated with FIG. 4A to FIG. 4H.

With the features of the cell current signal described above, the memory device can perform the Euclidean distance in memory searching (IMS) cell encoding. Specifically, the Euclidean distance D(x, y) can be represented as following equation (1).

$$D(x, y) = \sqrt{(x_1 - y_1)^2 + \ldots + (x_k - y_k)^2}. \quad \text{equation (1)}$$

In the equation (1), k is a positive integer, the data point x can be represented as k data values ($x_1, \ldots, x_k$) of k dimensions, and the data point y can be represented as k data values ($y_1, \ldots, y_k$) of k dimensions. The Euclidean distance D(x, y) is the Euclidean distance between the data point x and the data point y.

In some embodiments, the store bits can correspond to the data point x, the input bits can correspond to the data point y, and the memory device 100 can generate the bit line signal BL corresponding to the Euclidean distance D(x, y).

Specifically, the logic value of the store bit DT1 and the logic value of the input bit SB1 can correspond to the data value $x_1$ and the data value $y_1$, respectively. Correspondingly, the current values of the cell current signals ICL1 and ICR1 correspond to $(x_1-y_1)^2$. Multiple memory cells in the memory device 100 can generate multiple cell current signals corresponding to $(x_1-y_1)^2$ to $(x_k-y_k)^2$, and can sum the cell current signals at the node N11 to generate the bit line signal BL. At this moment, a current value of the bit line signal BL is proportional to the square of the Euclidean distance D(x, y). Further details of the Euclidean distance IMS cell encoding are described below with the embodiments associated with FIG. 4A to FIG. 5.

Figure 3:
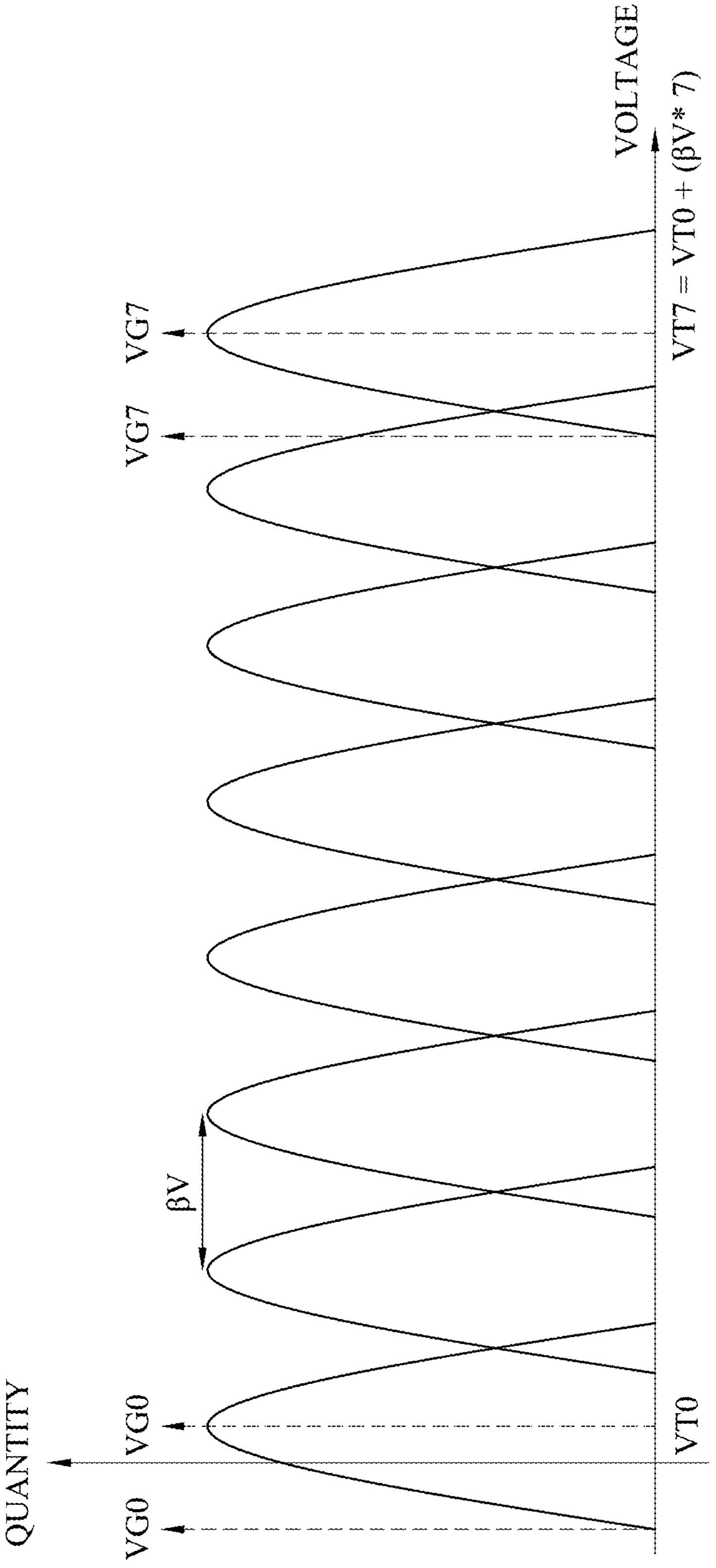
FIG. 3 is a schematic diagram of distributions of memory cells of the memory device illustrated according to some embodiments of present disclosure.

FIG. 3 is a schematic diagram of distributions of memory cells of the memory device 100 illustrated according to some embodiments of present disclosure. FIG. 3 is an alternative embodiment of FIG. 2. Therefore, some descriptions are not repeated for brevity. In FIG. 3, a horizontal axis of corresponds to voltage, and a vertical axis corresponds quantities of memory cells.

As shown in FIG. 3, in various embodiments, a location of the voltage level VG0 can located at the peak of the distribution of the threshold voltage level VT0 or the low bound of the distribution of the threshold voltage level VT0. Similarly, a location of the voltage level VG7 can located at the peak of the distribution of the threshold voltage level VT7 or the low bound of the distribution of the threshold voltage level VT7.

In some embodiments, a difference between the peaks of adjacent two threshold voltage levels is β volt (V). Correspondingly, the threshold voltage level VT7 is equal to the threshold voltage level VT0 plus seven multiplied by BV, in which seven is a difference between the logic value 0 and the logic value 7.

FIG. 4A to FIG. 4H are schematic diagrams of operations of the memory device 100 in different conditions, illustrated according to some embodiments of present disclosure. Referring to FIG. 1 and FIG. 4A to FIG. 4H, for brevity, some labels of the memory device 100, such as the labels of the switch elements TL1-TL96 and TR1-TR96 are not shown in FIG. 4A to FIG. 4H.

Figure 4A:
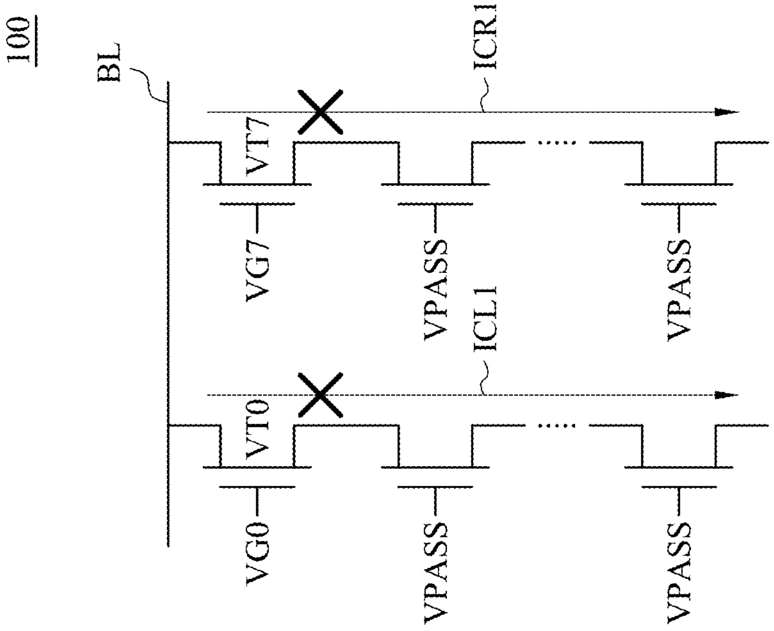
FIG. 4A to FIG. 4H are schematic diagrams of operations of the memory device in different conditions, illustrated according to some embodiments of present disclosure.

In the condition shown in FIG. 4A, each of the store bit DT1 and the input bit SB1 has the logic value 0. Correspondingly, the switch elements TL96 and TR96 have the threshold voltage levels VT0 and VT7, respectively, and the word line signals WLL96 and WLR96 have the voltage levels VG0 and VG7, respectively, such that the current values of the current signals ICL1 and ICR1 are equal to zero.

Figure 4B:
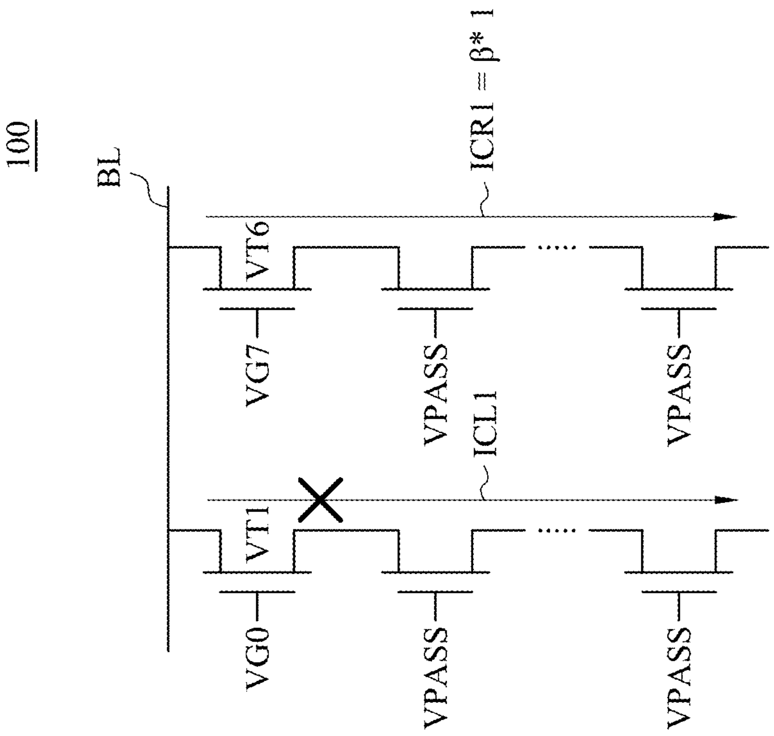

In the condition shown in FIG. 4B, the store bit DT1 and the input bit SB1 have the logic values 1 and 0, respectively. Correspondingly, the switch elements TL96 and TR96 have the threshold voltage levels VT1 and VT6, respectively, and the word line signals WLL96 and WLR96 have the voltage levels VG0 and VG7, respectively, such that the current values of the current signals ICL1 and ICR1 are equal to zero and B*1, respectively. In which 1 corresponds to a square of the difference 1 between the logic values 1 and the logic value 0.

Figure 4D:
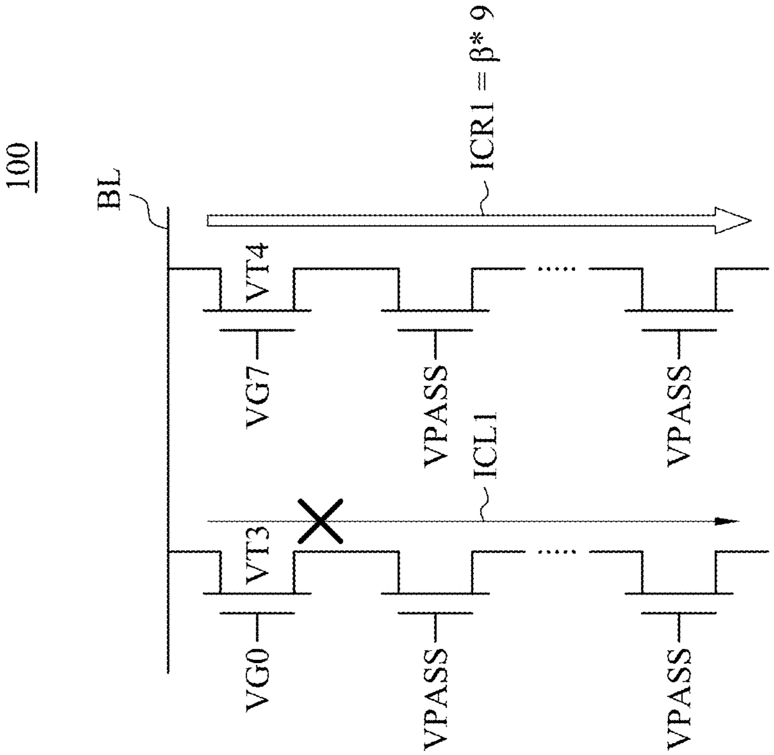
Figure 4C:
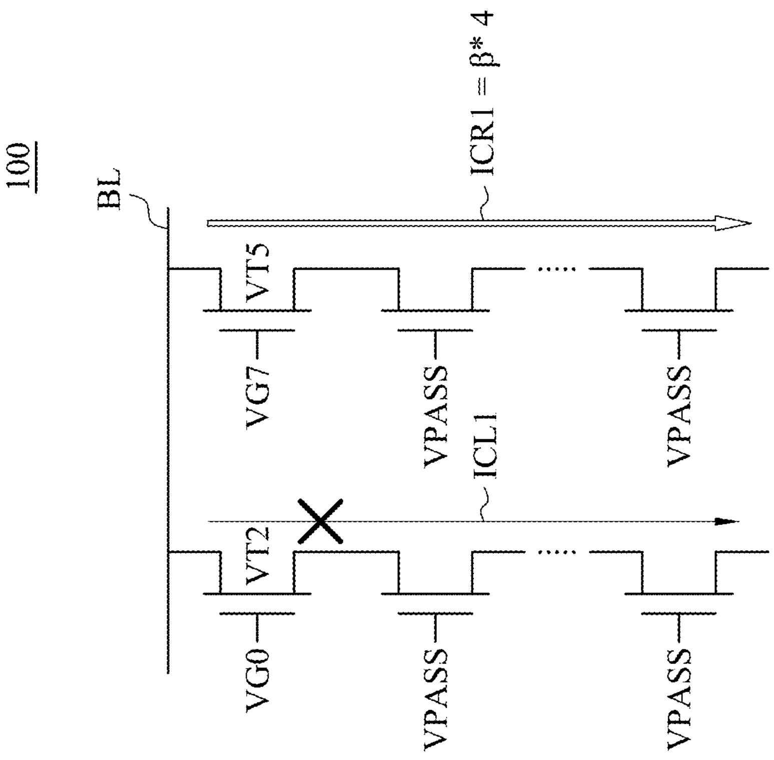

In the condition shown in FIG. 4C, the store bit DT1 and the input bit SB1 have the logic values 2 and 0, respectively. Correspondingly, the switch elements TL96 and TR96 have the threshold voltage levels VT2 and VT5, respectively, and the word line signals WLL96 and WLR96 have the voltage levels VG0 and VG7, respectively, such that the current values of the current signals ICL1 and ICR1 are equal to zero and β*4, respectively. In which 4 corresponds to a square of the difference 2 between the logic values 2 and the logic value 0.

In the condition shown in FIG. 4D, the store bit DT1 and the input bit SB1 have the logic values 3 and 0, respectively. Correspondingly, the switch elements TL96 and TR96 have the threshold voltage levels VT3 and VT4, respectively, and the word line signals WLL96 and WLR96 have the voltage levels VG0 and VG7, respectively, such that the current values of the current signals ICL1 and ICR1 are equal to zero and β*9, respectively. In which 9 corresponds to a square of the difference 3 between the logic values 3 and the logic value 0.

Figure 4E:
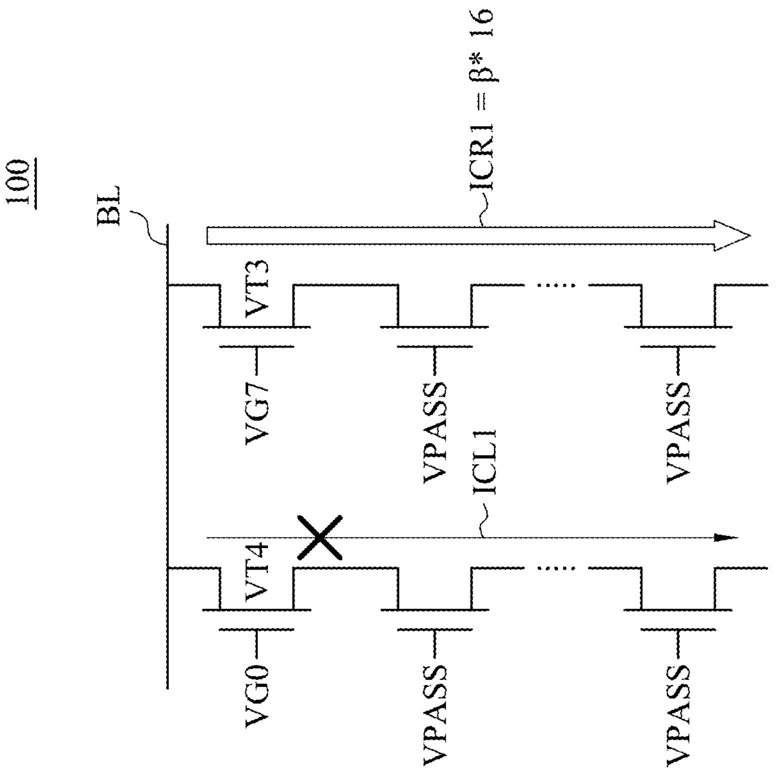

In the condition shown in FIG. 4E, the store bit DT1 and the input bit SB1 have the logic values 4 and 0, respectively. Correspondingly, the switch elements TL96 and TR96 have the threshold voltage levels VT4 and VT3, respectively, and the word line signals WLL96 and WLR96 have the voltage levels VG0 and VG7, respectively, such that the current values of the current signals ICL1 and ICR1 are equal to zero and β*16, respectively. In which 16 corresponds to a square of the difference 4 between the logic values 4 and the logic value 0.

Figure 4F:
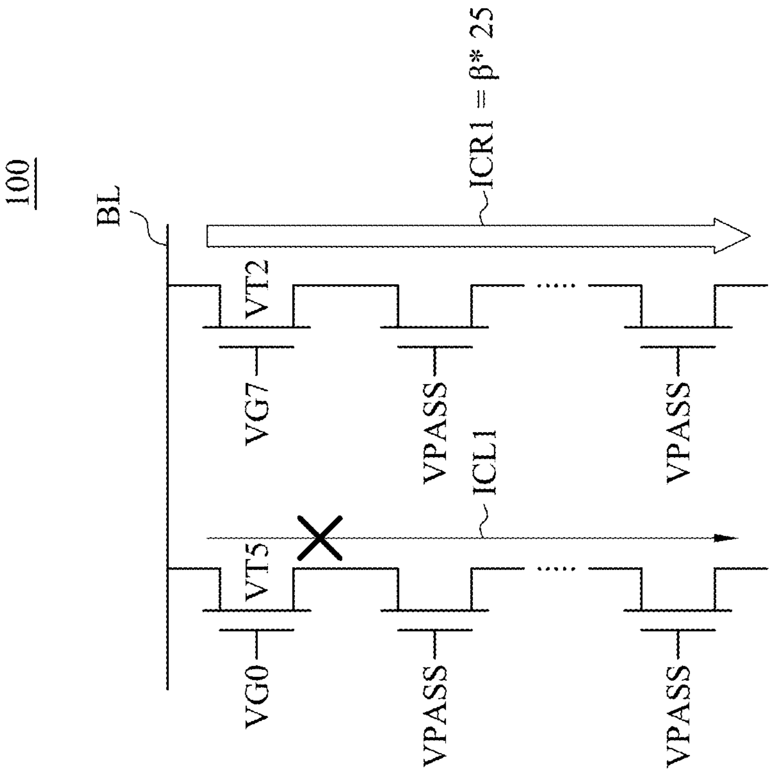

In the condition shown in FIG. 4F, the store bit DT1 and the input bit SB1 have the logic values 5 and 0, respectively. Correspondingly, the switch elements TL96 and TR96 have the threshold voltage levels VT5 and VT2, respectively, and the word line signals WLL96 and WLR96 have the voltage levels VG0 and VG7, respectively, such that the current values of the current signals ICL1 and ICR1 are equal to zero and β*25, respectively. In which 25 corresponds to a square of the difference 5 between the logic values 5 and the logic value 0.

Figure 4G:
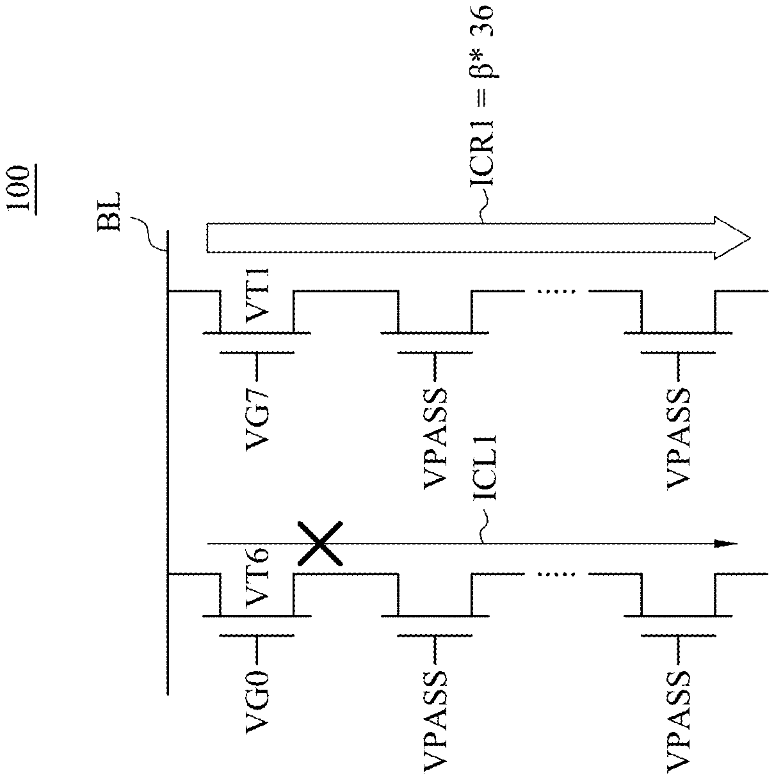

In the condition shown in FIG. 4G, the store bit DT1 and the input bit SB1 have the logic values 6 and 0, respectively. Correspondingly, the switch elements TL96 and TR96 have the threshold voltage levels VT6 and VT1, respectively, and the word line signals WLL96 and WLR96 have the voltage levels VG0 and VG7, respectively, such that the current values of the current signals ICL1 and ICR1 are equal to zero and β*36, respectively. In which 36 corresponds to a square of the difference 6 between the logic values 6 and the logic value 0.

Figure 4H:
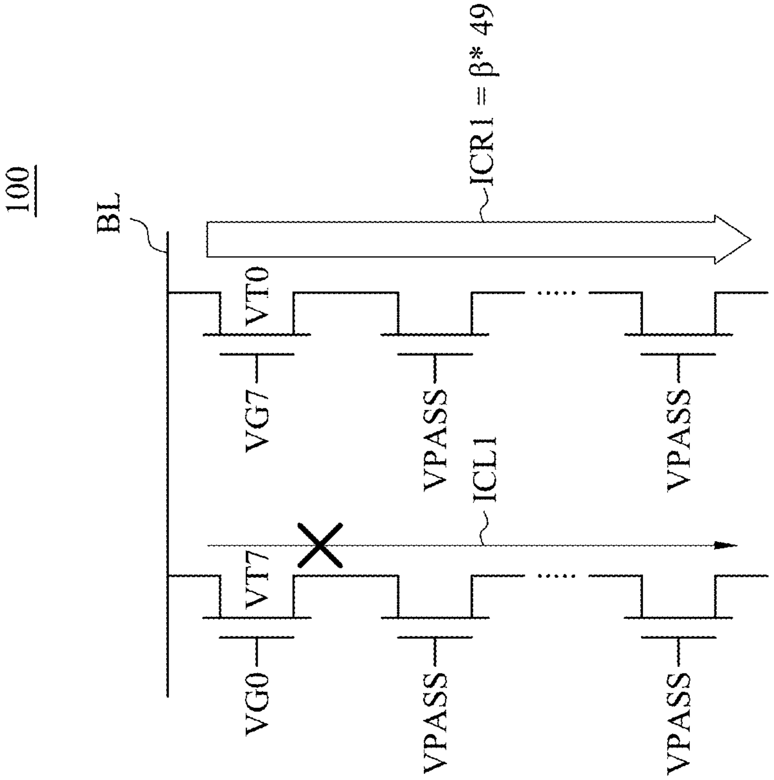

In the condition shown in FIG. 4H, the store bit DT1 and the input bit SB1 have the logic values 7 and 0, respectively. Correspondingly, the switch elements TL96 and TR96 have the threshold voltage levels VT7 and VT0, respectively, and the word line signals WLL96 and WLR96 have the voltage levels VG0 and VG7, respectively, such that the current values of the current signals ICL1 and ICR1 are equal to zero and β*49, respectively. In which 49 corresponds to a square of the difference 7 between the logic values 7 and the logic value 0.

Figure 5:
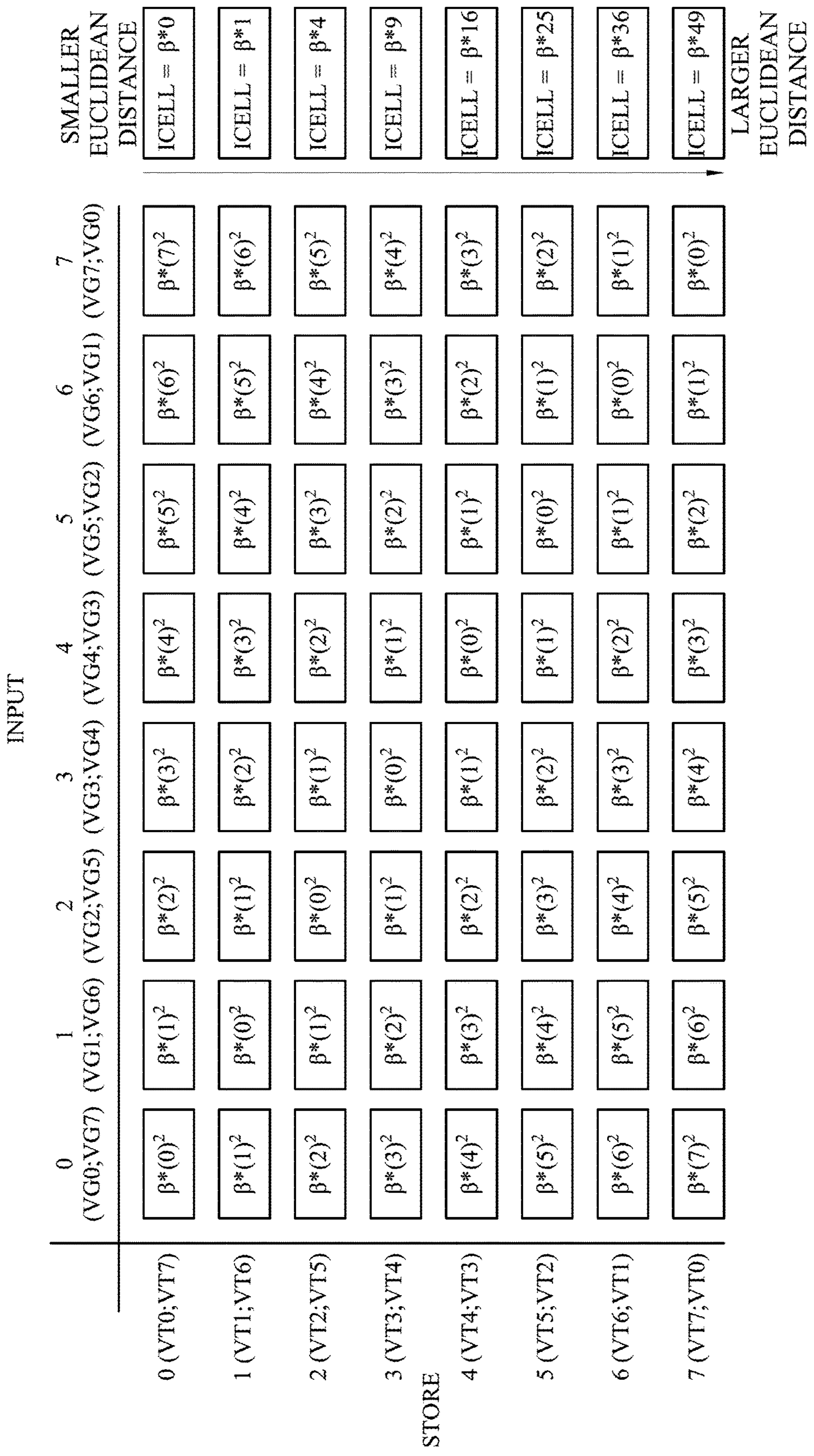
FIG. 5 is a schematic diagram of various conditions of the memory cell comparing the input bit and the store bit, illustrated according to some embodiments of present disclosure.

FIG. 5 is a schematic diagram of various conditions of the memory cell 102 comparing the input bit SB1 and the store bit DT1, illustrated according to some embodiments of present disclosure. As shown in FIG. 5, the memory cell 102 can operate in sixty-four conditions. The sixty-four conditions are arranged in eight columns and eight rows.

In the conditions of the first row, the input bit SB1 has the logic value 0. In the conditions of the second row, the input bit SB1 has the logic value 1. In the conditions of the third row, the input bit SB1 has the logic value 2. In the conditions of the fourth row, the input bit SB1 has the logic value 3. In the conditions of the fifth row, the input bit SB1 has the logic value 4. In the conditions of the sixth row, the input bit SB1 has the logic value 5. In the conditions of the seventh row, the input bit SB1 has the logic value 6. In the conditions of the eighth row, the input bit SB1 has the logic value 7.

In the conditions of the first column, the store bit DT1 has the logic value 0. In the conditions of the second column, the store bit DT1 has the logic value 1. In the conditions of the third column, the store bit DT1 has the logic value 2. In the conditions of the fourth column, the store bit DT1 has the logic value 3. In the conditions of the fifth column, the store bit DT1 has the logic value 4. In the conditions of the sixth column, the store bit DT1 has the logic value 5. In the conditions of the seventh column, the store bit DT1 has the logic value 6. In the conditions of the eighth column, the store bit DT1 has the logic value 7.

Referring to FIG. 4A to FIG. 5, the conditions of the first row to the eighth row in the first column correspond to the conditions of FIG. 4A to FIG. 4H, respectively. Therefore, some descriptions are not repeated for brevity.

In the condition of the second column and the first row, the current values of the cell current signals ICL1 and ICR1 are equal to β*1 and zero, respectively. In the condition of the second column and the second row, each of the current values of the cell current signals ICL1 and ICR1 is equal to zero. In the condition of the second column and the third row, the current values of the cell current signals ICL1 and ICR1 are equal to zero and β*1, respectively. In the condition of the second column and the fourth row, the current values of the cell current signals ICL1 and ICR1 are equal to zero and β*4, respectively. In the condition of the second column and the fifth row, the current values of the cell current signals ICL1 and ICR1 are equal to zero and β*9, respectively. In the condition of the second column and the sixth row, the current values of the cell current signals ICL1 and ICR1 are equal to zero and β*16, respectively. In the condition of the second column and the seventh row, the current values of the cell current signals ICL1 and ICR1 are equal to zero and β*25, respectively. In the condition of the second column and the eighth row, the current values of the cell current signals ICL1 and ICR1 are equal to zero and β*36, respectively.

In the condition of the third column and the first row, the current values of the cell current signals ICL1 and ICR1 are equal to β*4 and zero, respectively. In the condition of the third column and the second row, the current values of the cell current signals ICL1 and ICR1 are equal to β*1 and zero, respectively. In the condition of the third column and the third row, each of the current values of the cell current signals ICL1 and ICR1 is equal to zero. In the condition of the third column and the fourth row, the current values of the cell current signals ICL1 and ICR1 are equal to zero and β*1, respectively. In the condition of the third column and the fifth row, the current values of the cell current signals ICL1 and ICR1 are equal to zero and β*4, respectively. In the condition of the third column and the sixth row, the current values of the cell current signals ICL1 and ICR1 are equal to zero and β*9, respectively. In the condition of the third column and the seventh row, the current values of the cell current signals ICL1 and ICR1 are equal to zero and β*16, respectively. In the condition of the third column and the eighth row, the current values of the cell current signals ICL1 and ICR1 are equal to zero and β*25, respectively.

In the condition of the fourth column and the first row, the current values of the cell current signals ICL1 and ICR1 are equal to β*9 and zero, respectively. In the condition of the fourth column and the second row, the current values of the cell current signals ICL1 and ICR1 are equal to β*4 and zero, respectively. In the condition of the fourth column and the third row, the current values of the cell current signals ICL1 and ICR1 are equal to β*1 and zero, respectively. In the condition of the fourth column and the fourth row, each of the current values of the cell current signals ICL1 and ICR1 is equal to zero. In the condition of the fourth column and the fifth row, the current values of the cell current signals ICL1 and ICR1 are equal to zero and β*1, respectively. In the condition of the fourth column and the sixth row, the current values of the cell current signals ICL1 and ICR1 are equal to zero and β*4, respectively. In the condition of the fourth column and the seventh row, the current values of the cell current signals ICL1 and ICR1 are equal to zero and β*9, respectively. In the condition of the fourth column and the eighth row, the current values of the cell current signals ICL1 and ICR1 are equal to zero and β*16, respectively.

In the condition of the fifth column and the first row, the current values of the cell current signals ICL1 and ICR1 are equal to β*16 and zero, respectively. In the condition of the fifth column and the second row, the current values of the cell current signals ICL1 and ICR1 are equal to β*9 and zero, respectively. In the condition of the fifth column and the third row, the current values of the cell current signals ICL1 and ICR1 are equal to β*4 and zero, respectively. In the condition of the fifth column and the fourth row, the current values of the cell current signals ICL1 and ICR1 are equal to β*1 and zero, respectively. In the condition of the fifth column and the fifth row, each of the current values of the cell current signals ICL1 and ICR1 is equal to zero. In the condition of the fifth column and the sixth row, the current values of the cell current signals ICL1 and ICR1 are equal to zero and β*1, respectively. In the condition of the fifth column and the seventh row, the current values of the cell current signals ICL1 and ICR1 are equal to zero and β*4, respectively. In the condition of the fifth column and the eighth row, the current values of the cell current signals ICL1 and ICR1 are equal to zero and β*9, respectively.

In the condition of the sixth column and the first row, the current values of the cell current signals ICL1 and ICR1 are equal to β*25 and zero, respectively. In the condition of the sixth column and the second row, the current values of the cell current signals ICL1 and ICR1 are equal to β*16 and zero, respectively. In the condition of the sixth column and the third row, the current values of the cell current signals ICL1 and ICR1 are equal to β*9 and zero, respectively. In the condition of the sixth column and the fourth row, the current values of the cell current signals ICL1 and ICR1 are equal to β*4 and zero, respectively. In the condition of the sixth column and the fifth row, the current values of the cell current signals ICL1 and ICR1 are equal to β*1 and zero, respectively. In the condition of the sixth column and the sixth row, each of the current values of the cell current signals ICL1 and ICR1 is equal to zero. In the condition of the sixth column and the seventh row, the current values of the cell current signals ICL1 and ICR1 are equal to zero and β*1, respectively. In the condition of the sixth column and the eighth row, the current values of the cell current signals ICL1 and ICR1 are equal to zero and β*4, respectively.

In the condition of the sixth column and the first row, the current values of the cell current signals ICL1 and ICR1 are equal to β*25 and zero, respectively. In the condition of the sixth column and the second row, the current values of the cell current signals ICL1 and ICR1 are equal to β*16 and zero, respectively. In the condition of the sixth column and the third row, the current values of the cell current signals ICL1 and ICR1 are equal to β*9 and zero, respectively. In the condition of the sixth column and the fourth row, the current values of the cell current signals ICL1 and ICR1 are equal to β*4 and zero, respectively. In the condition of the sixth column and the fifth row, the current values of the cell current signals ICL1 and ICR1 are equal to β*1 and zero, respectively. In the condition of the sixth column and the sixth row, each of the current values of the cell current signals ICL1 and ICR1 is equal to zero. In the condition of the sixth column and the seventh row, the current values of the cell current signals ICL1 and ICR1 are equal to zero and β*1, respectively. In the condition of the sixth column and the eighth row, the current values of the cell current signals ICL1 and ICR1 are equal to zero and β*4, respectively.

In the condition of the seventh column and the first row, the current values of the cell current signals ICL1 and ICR1 are equal to β*36 and zero, respectively. In the condition of the seventh column and the second row, the current values of the cell current signals ICL1 and ICR1 are equal to β*25 and zero, respectively. In the condition of the seventh column and the third row, the current values of the cell current signals ICL1 and ICR1 are equal to β*16 and zero, respectively. In the condition of the seventh column and the fourth row, the current values of the cell current signals ICL1 and ICR1 are equal to β*9 and zero, respectively. In the condition of the seventh column and the fifth row, the current values of the cell current signals ICL1 and ICR1 are equal to β*4 and zero, respectively. In the condition of the seventh column and the sixth row, the current values of the cell current signals ICL1 and ICR1 are equal to β*1 and zero, respectively. In the condition of the seventh column and the seventh row, each of the current values of the cell current signals ICL1 and ICR1 is equal to zero. In the condition of the seventh column and the eighth row, the current values of the cell current signals ICL1 and ICR1 are equal to zero and β*1, respectively.

In the condition of the eighth column and the first row, the current values of the cell current signals ICL1 and ICR1 are equal to β*49 and zero, respectively. In the condition of the eighth column and the second row, the current values of the cell current signals ICL1 and ICR1 are equal to β*36 and zero, respectively. In the condition of the eighth column and the third row, the current values of the cell current signals ICL1 and ICR1 are equal to β*25 and zero, respectively. In the condition of the eighth column and the fourth row, the current values of the cell current signals ICL1 and ICR1 are equal to β*16 and zero, respectively. In the condition of the eighth column and the fifth row, the current values of the cell current signals ICL1 and ICR1 are equal to β*9 and zero, respectively. In the condition of the eighth column and the sixth row, the current values of the cell current signals ICL1 and ICR1 are equal to β*4 and zero, respectively. In the condition of the eighth column and the seventh row, the current values of the cell current signals ICL1 and ICR1 are equal to β*1 and zero, respectively. In the condition of the eighth column and the eighth row, each of the current values of the cell current signals ICL1 and ICR1 is equal to zero.

In some embodiments, a current value of a cell current signal ICELL flowing through the memory cell 102 is a summation of the current values of the cell current signal ICL1 and ICR1. When the current value of the cell current signal ICELL is smaller, the Euclidean distance D(x, y) is smaller. When the current value of the cell current signal ICELL is larger, the Euclidean distance D(x, y) is larger. In the conditions those a difference between the logic value of the store bit DT1 and the logic value of the input bit SB1 is equal to 0 to 7, the cell current signal ICELL has the current values β*0, β*1, β*4, β*9, β*16, β*25, β*36 and β*49, respectively.

Figure 6A:
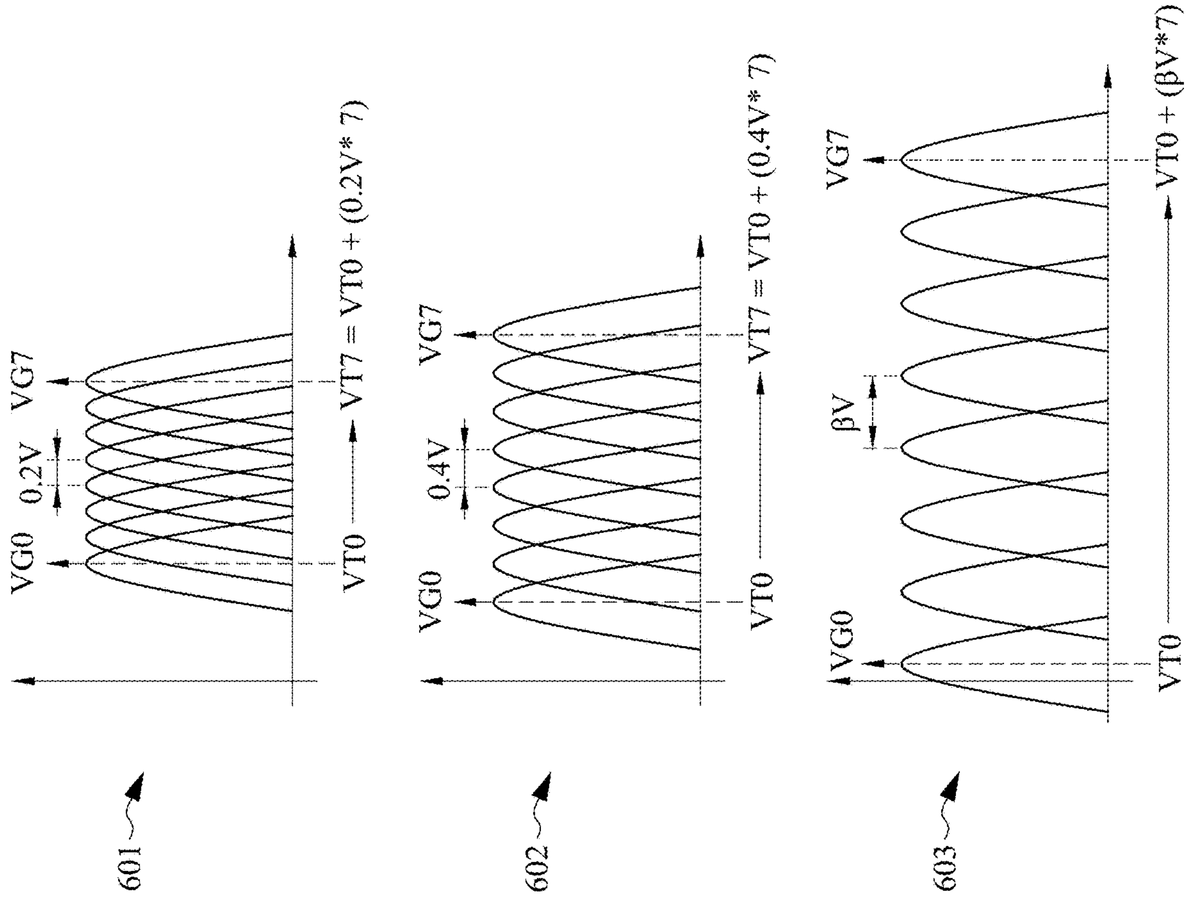
FIG. 6A is a schematic diagram of various memory cell distribution designs, illustrated according to some embodiments of present disclosure.

FIG. 6A is a schematic diagram of various memory cell distribution designs, illustrated according to some embodiments of present disclosure. FIG. 6A includes distribution diagrams 601-603. In the distribution diagrams 601-603, a horizontal axis of corresponds to voltage, and a vertical axis corresponds quantities of memory cells.

As shown in FIG. 6A, in the distribution diagrams 601-603, the memory cells can have distributions corresponding to the threshold voltage levels VT0-VT7. The threshold voltage levels VT0-VT7 are arranged in order along the horizontal axis. The voltage levels VG0-VG7 correspond to the threshold voltage levels VT0-VT7, respectively.

In the embodiment corresponding to the distribution diagram 601, adjacent two of the threshold voltage levels VT0-VT7 are separated from each other by 0.2 volt (V). Accordingly, the threshold voltage level VT7 is equal to the threshold voltage level VT0 plus 0.2 V multiplied by 7.

In the embodiment corresponding to the distribution diagram 602, adjacent two of the threshold voltage levels VT0-VT7 are separated from each other by 0.4 volt (V). Accordingly, the threshold voltage level VT7 is equal to the threshold voltage level VT0 plus 0.4 V multiplied by 7.

In the embodiment corresponding to the distribution diagram 601, adjacent two of the threshold voltage levels VT0-VT7 are separated from each other by β volt (V). Accordingly, the threshold voltage level VT7 is equal to the threshold voltage level VT0 plus β V multiplied by 7.

Figure 6B:
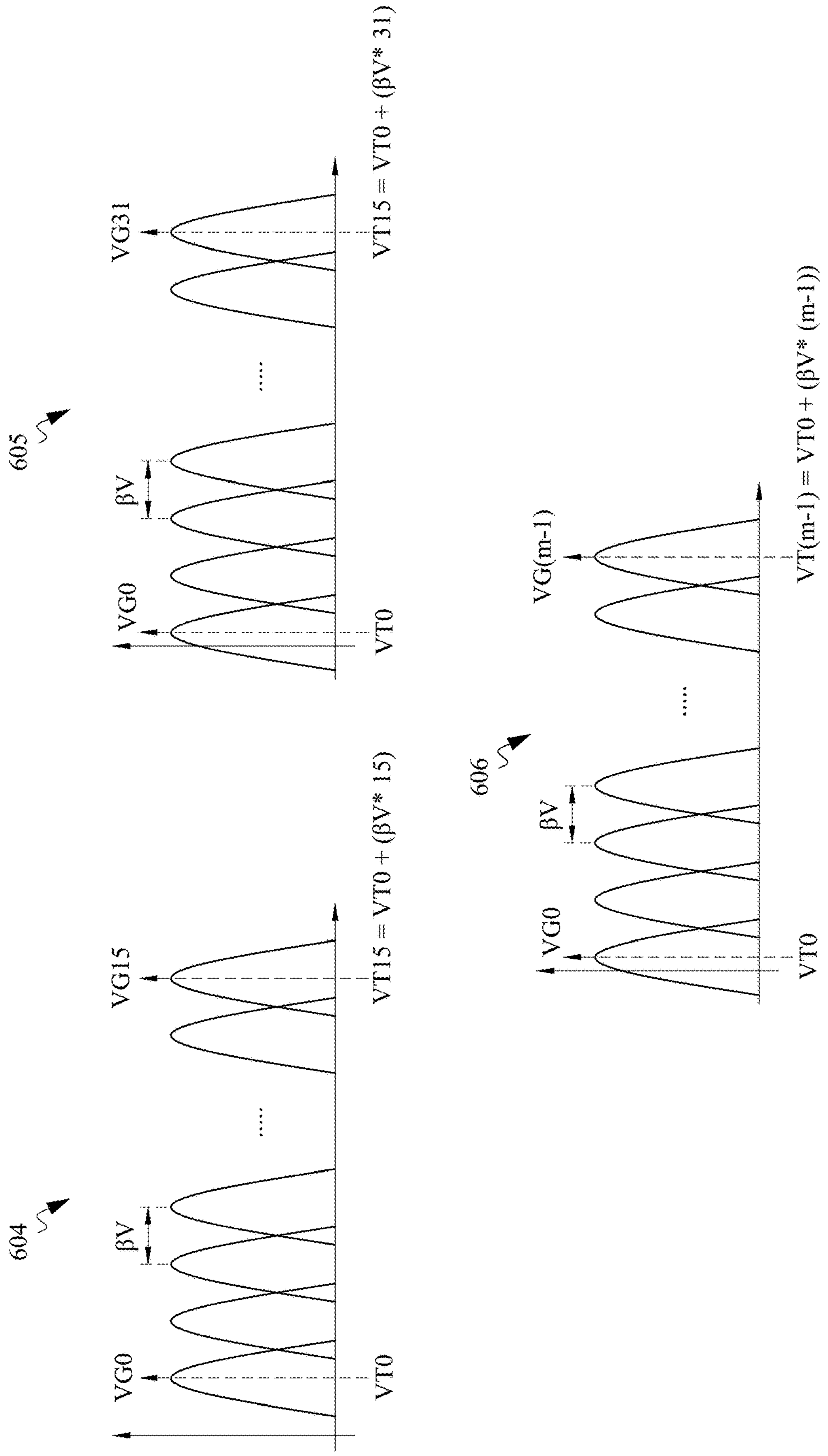
FIG. 6B is a schematic diagram of various memory cell distribution designs, illustrated according to some embodiments of present disclosure.

FIG. 6B is a schematic diagram of various memory cell distribution designs, illustrated according to some embodiments of present disclosure. FIG. 6A includes distribution diagrams 604-606. In the distribution diagrams 604-606, a horizontal axis of corresponds to voltage, and a vertical axis corresponds quantities of memory cells.

In the embodiment corresponding to the distribution diagram 604, the distributions of the memory cells corresponding to 16 levels of threshold voltage levels VT0-VT15, respectively. Adjacent two of the threshold voltage levels VT0-VT15 are separated from each other by β volt (V). Accordingly, the threshold voltage level VT15 is equal to the threshold voltage level VT0 plus β V multiplied by 15.

In the embodiment corresponding to the distribution diagram 605, the distributions of the memory cells corresponding to 32 levels of threshold voltage levels VT0-VT31, respectively. Adjacent two of the threshold voltage levels VT0-VT31 are separated from each other by β volt (V). Accordingly, the threshold voltage level VT31 is equal to the threshold voltage level VT0 plus β V multiplied by 31.

In the embodiment corresponding to the distribution diagram 606, the distributions of the memory cells corresponding to m levels of threshold voltage levels VT0-VT(m−1), respectively. Adjacent two of the threshold voltage levels VT0-VT(m−1) are separated from each other by β volt (V). Accordingly, the threshold voltage level VT(m−1) is equal to the threshold voltage level VT0 plus β V multiplied by (m−1).

Figure 7A:
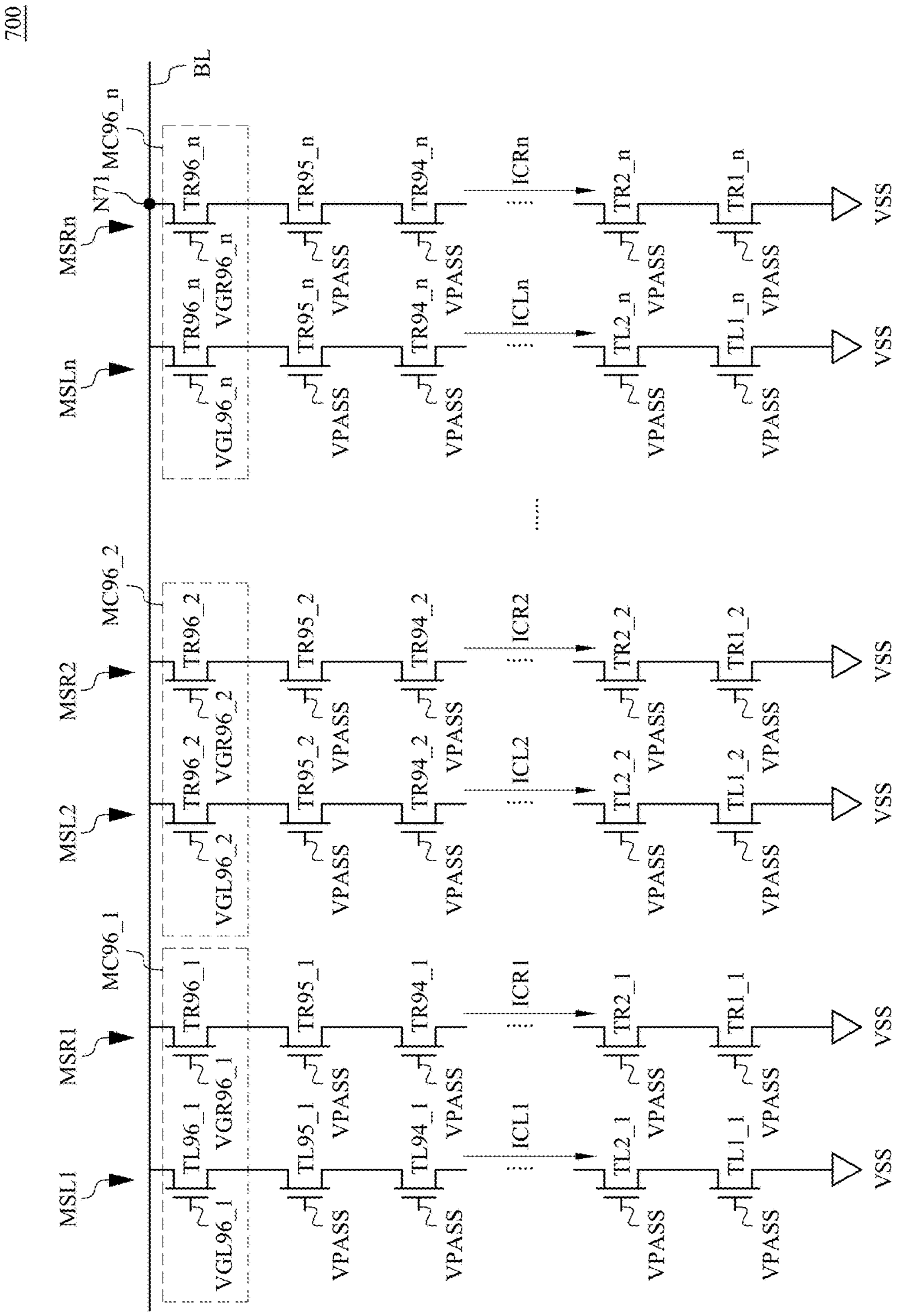
FIG. 7A is a schematic diagram of a memory device performing a search operation, illustrated according to some embodiments of present disclosure.

FIG. 7A is a schematic diagram of a memory device 700 performing a search operation, illustrated according to some embodiments of present disclosure. As shown in FIG. 7A, the memory device 700 includes memory strings MSL1-MSLn and MSR1-MSRn, in which n is a positive integer. The memory string MSL1 includes switch elements TL1_1-TL96_1 coupled in series with each other. The memory string MSR1 includes switch elements TR1_1-TR96_1 coupled in series with each other. The memory string MSL2 includes switch elements TL1_2-TL96_2 coupled in series with each other. The memory string MSR2 includes switch elements TR1_2-TR96_2 coupled in series with each other, and so on. The memory string MSLn includes switch elements TL1_*n*-TL96_*n* coupled in series with each other. The memory string MSRn includes switch elements TR1_*n*-TR96_*n* coupled in series with each other.

In some embodiments, control terminals the switch elements TL1_1-TL96_1 and TR1_1-TR96_1 are configured to receive word line signals WLL1_1-WLL96_1 and WLR1_1-WLR96_1, respectively. Control terminals the switch elements TL1_2-TL96_2 and TR1_2-TR96_2 are configured to receive word line signals WLL1_2-WLL96_2 and WLR1_2-WLR96_2, respectively, and so on. Control terminals the switch elements TL1_*n*-TL96_*n* and TR1_*n*-TR96_*n* are configured to receive word line signals WLL1_*n*-WLL96_*n* and WLR1_*n*-WLR96_*n*, respectively.

In some embodiments, the memory strings MSL1-MSLn and MSR1-MSRn are configured to generate cell current signals ICL1-ICLn and ICR1-ICRn, respectively. The memory strings MSL1-MSLn and MSR1-MSRn are coupled to each other at a node N71, and configured to sum the cell current signals ICL1-ICLn and ICR1-ICRn at the node N71 to generate the bit line signal BL.

In some embodiments, two switch elements in the same row of two adjacent memory strings can operate as one memory cell. For example, the switch elements TL96_1 and TR96_1 can operate as a memory cell MC96_1. The switch elements TL95_1 and TR95_1 can operate as a memory cell MC95_1, and so on. The switch elements TL1_1 and TR1_1 can operate as a memory cell MC1_1.

Similarly, the switch elements TL96_2 and TR96_2 can operate as a memory cell MC96_2. The switch elements TL95_2 and TR95_2 can operate as a memory cell MC95_2, and so on. The switch elements TL1_2 and TR1_2 can operate as a memory cell MC1_2, and so on. The switch elements TL96_*n* and TR96_*n* can operate as a memory cell MC96_*n*. The switch elements TL95_*n* and TR95_*n* can operate as a memory cell MC95_*n*, and so on. The switch elements TL1_*n* and TR1_*n* can operate as a memory cell MC1_*n*

Referring to FIG. 7A and FIG. 1, the memory device 700 is an embodiment of the memory device 100. Features of each of the memory strings MSL1-MSLn are similar with the features of the memory string MSL. Features of each of the memory strings MSR1-MSRn are similar with the features of the memory string MSR. Features of the switch elements TL1_1-TL96_1, TL1_2-TL96_2, . . . , and TL1_*n*-TL96_*n* are similar with the features of the switch elements TL1-TL96. Features of the switch elements TR1_1-TR96_1, TR1_2-TR96_2, . . . , and TR1_*n*-TR96_*n* are similar with the features of the switch elements TR1-TR96. Features of each of the cell current signals ICL1-ICLn are similar with the features of the cell current signals ICL. Features of each of the cell current signals ICR1-ICRn are similar with the features of the cell current signals ICR. Features of each of the memory cells MC96_1-MC96_*n* are similar with the features of the memory cell 102. The node N11 corresponds to the node N71. Therefore, some descriptions are not repeated for brevity.

In some embodiments, the memory cells MC96_1-MC96_*n* are configured to store multiple store bits x96_1-*x*96_*n*, respectively. Accordingly, the switch elements in the memory cells MC96_1-MC96_*n* have the threshold voltage levels corresponding to the logic values of the store bits x96_1-*x*96_*n*.

In the embodiment shown in FIG. 7A, the word line signals WLL96_1 and WLR96_1 are configured to carry an input bit y96_1 and configured to have search bias levels VGL96_1 and VGR96_1. The word line signals WLL96_2 and WLR96_2 are configured to carry an input bit y96_2 and configured to have search bias levels VGL96_2 and VGR96_2, and so on. The word line signals WLL96_*n* and WLR96_*n* are configured to carry an input bit y96_*n* and configured to have search bias levels VGL96_*n* and VGR96_*n*. At this moment, each of the word line signals WLL1_1-WLL95_1, WLR1_1-WLR95_1, WLL1_2-WLL95_2, WLR1_2-WLR95_2, WLL1_*n*-WLL95_*n*, WLR1_*n*-WLR95_*n* has the pass voltage level VPASS, such that each of the switch elements TL1_1-TL95_1, TR1_1-TR95_1, TL1_2-TL95_2, TR1_2-TR95_2, . . . , TL1_*n*-TL95_*n*, TR1_*n*-TR95_*n* is turned on.

During to search operation, the memory cell MC96-1 is configured to compare the store bit x96_1 and the input bit y96_1 to generate a cell current signal ICELL1. The cell current signal ICELL1 is a summation of the cell current signal ICL1 and ICR1. At this moment, a current value of the cell current signal ICELL1 is proportional to $(x96\_1-y96\_1)^2$, in which $(x96\_1-y96\_1)^2$ is a square of a difference between a logic value of the store bit x96_1 and a logic value of the input bit y96_1.

Similarly, the memory cell MC96_2 is configured to compare the store bit x96_2 and the input bit y96_2 to generate a cell current signal ICELL2. The cell current signal ICELL2 is a summation of the cell current signal ICL2 and ICR2. At this moment, a current value of the cell current signal ICELL2 is proportional to $(x96\_2-y96\_2)^2$, in which $(x96\_2-y96\_2)^2$ is a square of a difference between a logic value of the store bit x96_2 and a logic value of the input bit y96_2, and so on. The memory cell MC96_*n* is configured to compare the store bit x96_*n* and the input bit y96_*n* to generate a cell current signal ICELLn. The cell current signal ICELLn is a summation of the cell current signal ICLn and ICRn. At this moment, a current value of the cell current signal ICELLn is proportional to $(x96\_n-y96\_n)^2$, in which $(x96\_n-y96\_n)^2$ is a square of a difference between a logic value of the store bit x96_*n* and a logic value of the input bit y96_*n*.

Then, the memory device 700 is configured to sum the cell current signals ICELL1-ICELLn at the node N71, to generate the bit line signal BL. At this moment, the current value of the bit line signal BL is proportional to a square value $$D_{96}^2(x, y)$$

of the Euclidean distance $D_{96}(x, y)$. The Euclidean distance $D_{96}(x, y)$ represents the Euclidean distance between a data point corresponding to the store bits x96_1-*x*96_*n* and a data point corresponding to the input bits y96_1-*y*96_*n*. The square value $$D_{96}^2(x, y)$$

can be represented by the following equation (2).

$$D_{96}^2(x, y) = (x96\_1 - y96\_1)^2 + (x96\_2 - y96\_2)^2 + \ldots + (x96\_n - y96\_n)^2. \quad \text{equation (2)}$$

As a result, the memory device 700 can perform current summation by wired OR logic operation, to generate the bit line signal BL corresponding to the square value $$D_{96}^2(x, y).$$

Figure 7B:
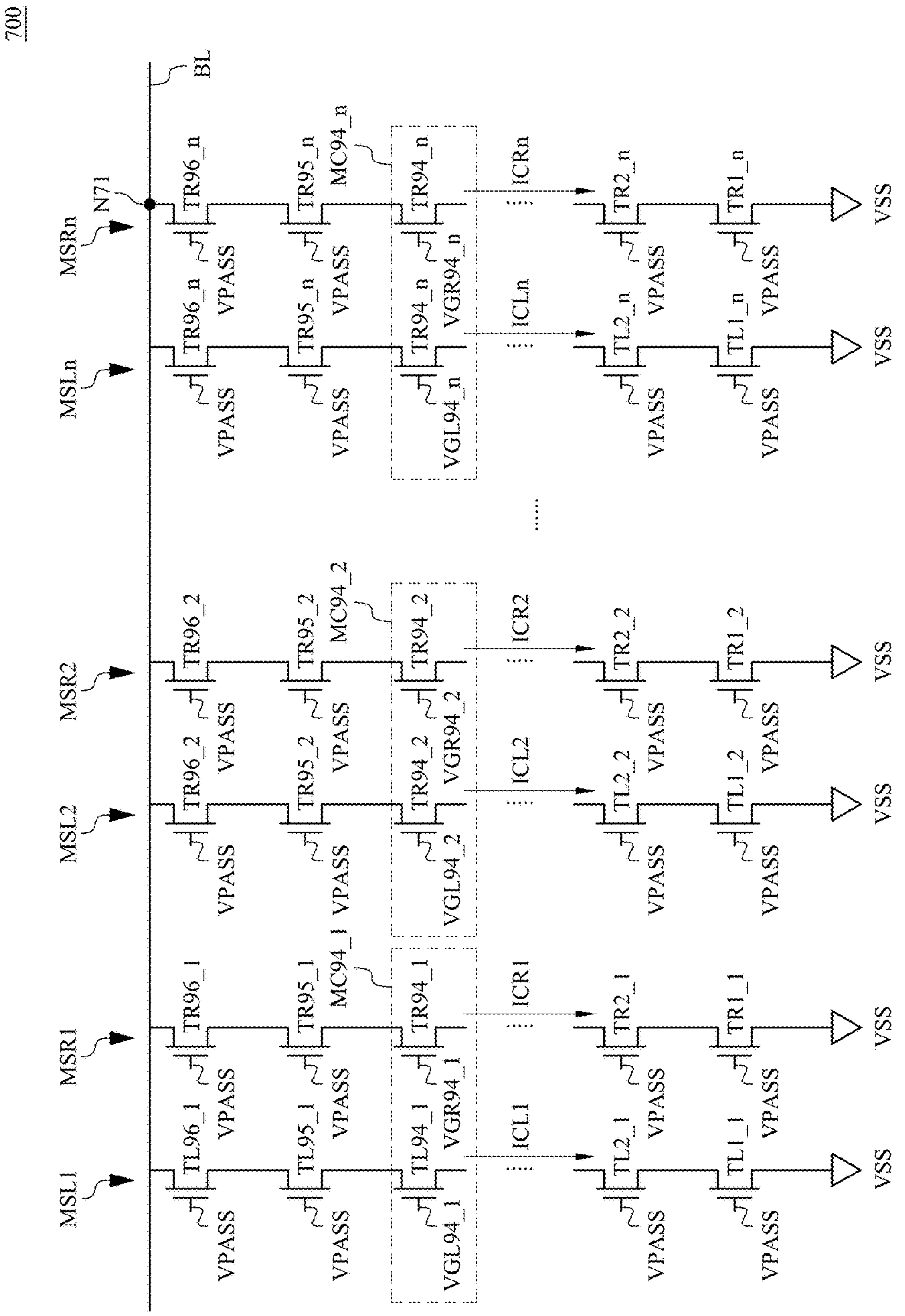
FIG. 7B is a schematic diagram of a memory device performing a search operation, illustrated according to some embodiments of present disclosure.

FIG. 7B is a schematic diagram of a memory device 700 performing a search operation, illustrated according to some embodiments of present disclosure. In some embodiments, the memory cells MC94_1-MC94_*n* are configured to store multiple store bits x94_1-*x*94_*n*, respectively. Accordingly, the switch elements in the memory cells MC94_1-MC94_*n* have the threshold voltage levels corresponding to the logic values of the store bits x94_1-*x*94_*n*.

In the embodiment shown in FIG. 7B, the word line signals WLL94_1 and WLR94_1 are configured to carry an input bit y94_1 and configured to have search bias levels VGL94_1 and VGR94_1. The word line signals WLL94_2 and WLR94_2 are configured to carry an input bit y94_2 and configured to have search bias levels VGL94_2 and VGR94_2, and so on. The word line signals WLL94_*n* and WLR94_*n* are configured to carry an input bit y94_*n* and configured to have search bias levels VGL94_*n* and VGR94_*n*. At this moment, each of the word line signals WLL1_1-WLL93_1, WLL95_1, WLL96_1, WLR1_1-WLR93_1, WLR95_1, WLR96_1, WLL1_2-WLL93_2, WLL95_2, WLL96_2, WLR1_2-WLR93_2, WLR95_2, WLR96_2, . . . , WLL1_*n*-WLL93_*n*, WLL95_*n*, WLL96_*n*, WLR1_*n*-WLR93_*n*, WLR95_*n*, WLR96_*n* has the pass voltage level VPASS, such that each of the switch elements TL1_1-TL93_1, TL95_1, TL96_1, TR1_1-TR93_1, TR95_1, TR96_1, TL1_2-TL93_2, TL95_2, TL96_2, TR1_2-TR93_2, TR95_2, TR96_2, . . . , TL1_*n*-TL93_*n*, TL95_*n*, TL96_*n*, TR1_*n*-TR93_*n*, TR95_*n*, TR96_*n* is turned on.

During to search operation, the memory cell MC94-1 is configured to compare the store bit x94_1 and the input bit y94_1 to generate a cell current signal ICELL1. The cell current signal ICELL1 is a summation of the cell current signal ICL1 and ICR1. At this moment, a current value of the cell current signal ICELL1 is proportional to $(x94\_1-y94\_1)^2$, in which $(x94\_1-y94\_1)^2$ is a square of a difference between a logic value of the store bit x94_1 and a logic value of the input bit y94_1.

Similarly, the memory cell MC94-2 is configured to compare the store bit x94_2 and the input bit y94_2 to generate a cell current signal ICELL2. The cell current signal ICELL2 is a summation of the cell current signal ICL2 and ICR2. At this moment, a current value of the cell current signal ICELL2 is proportional to $(x94\_2-y94\_2)^2$, in which $(x94\_2-y94\_2)^2$ is a square of a difference between a logic value of the store bit x94_2 and a logic value of the input bit y94_2, and so on. The memory cell MC94_*n* is configured to compare the store bit x94_*n* and the input bit y94_*n* to generate a cell current signal ICELLn. The cell current signal ICELLn is a summation of the cell current signal ICLn and ICRn. At this moment, a current value of the cell current signal ICELLn is proportional to $(x94\_n-y94\_n)^2$, in which $(x94\_n-y94\_n)^2$ is a square of a difference between a logic value of the store bit x94_*n* and a logic value of the input bit y94_*n*.

Then, the memory device 700 is configured to sum the cell current signals ICELL1-ICELLn at the node N71, to generate the bit line signal BL. At this moment, the current value of the bit line signal BL is proportional to a square value $$D_{94}^2(x, y)$$

of the Euclidean distance $D_{94}(x, y)$. The Euclidean distance $D_{94}(x, y)$ represents the Euclidean distance between a data point corresponding to the store bits x94_1-*x*94_*n* and a data point corresponding to the input bits y94_1-*y*94_*n*. The square value $$D_{94}^2(x, y)$$

can be represented by following equation (3).

$$D_{94}^2(x, y) = (x94\_1 - y94\_1)^2 + (x94\_2 - y94\_2)^2 + \ldots + (x94\_n - y94\_n)^2. \quad \text{equation (3)}$$

As a result, the memory device 700 can perform current summation by wired OR logic operation, to generate the bit line signal BL corresponding to the square value $$D_{94}^2(x, y).$$

Figure 7C:
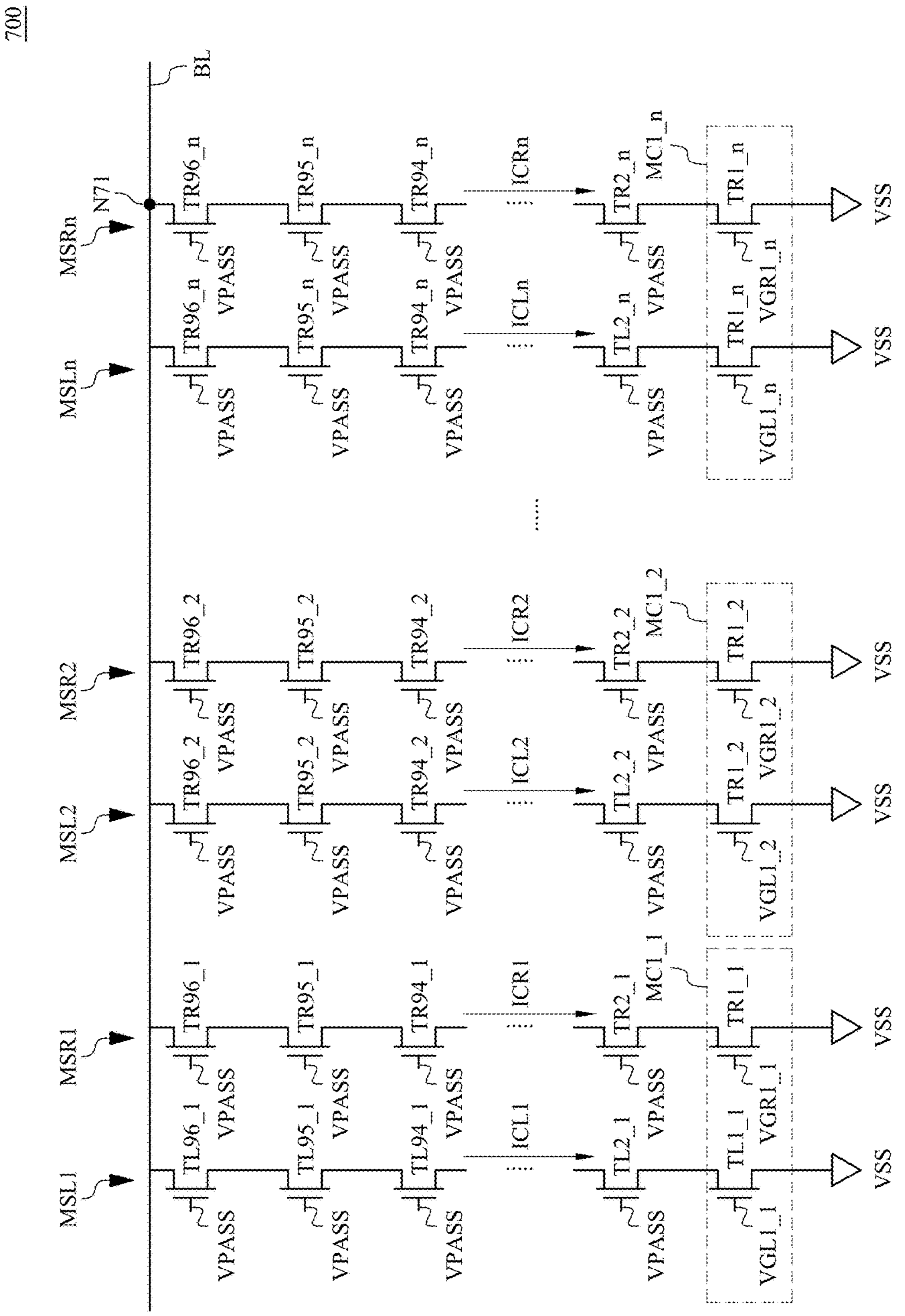
FIG. 7C is a schematic diagram of a memory device performing a search operation, illustrated according to some embodiments of present disclosure.

FIG. 7C is a schematic diagram of a memory device 700 performing a search operation, illustrated according to some embodiments of present disclosure. In some embodiments, the memory cells MC1_1-MC1_*n* are configured to store multiple store bits x1_1-*x*1_*n*, respectively. Accordingly, the switch elements in the memory cells MC1_1-MC1_*n* have the threshold voltage levels corresponding to the logic values of the store bits x1_1-*x*1_*n*.

In the embodiment shown in FIG. 7C, the word line signals WLL1_1 and WLR1_1 are configured to carry an input bit y1_1 and configured to have search bias levels VGL1_1 and VGR1_1. The word line signals WLL1_2 and WLR1_2 are configured to carry an input bit y1_2 and configured to have search bias levels VGL1_2 and VGR1_2, and so on. The word line signals WLL1_*n* and WLR1_*n* are configured to carry an input bit y1_*n* and configured to have search bias levels VGL1_*n* and VGR1_*n*. At this moment, each of the word line signals WLL2_1-WLL96_1, WLR2_1-WLR96_1, WLL2_2-WLL96_2, WLR2_2-WLR96_2, . . . , WLL2_*n*-WLL96_*n*, WLR2_*n*-WLR96_*n* has the pass voltage level VPASS, such that each of the switch elements TL2_1-TL96_1, TR2_1-TR96_1, TL2_2-TL96_2, TR2_2-TR96_2, TL2_*n*-TL96_*n*, TR2_*n*-TR96_*n* is turned on.

During to search operation, the memory cell MC1-1 is configured to compare the store bit x1_1 and the input bit y1_1 to generate a cell current signal ICELL1. The cell current signal ICELL1 is a summation of the cell current signal ICL1 and ICR1. At this moment, a current value of the cell current signal ICELL1 is proportional to $(x1\_1-y1\_1)^2$, in which $(x1\_1-y1\_1)^2$ is a square of a difference between a logic value of the store bit x1_1 and a logic value of the input bit y1_1.

Similarly, the memory cell MC1-2 is configured to compare the store bit x1_2 and the input bit y1_2 to generate a cell current signal ICELL2. The cell current signal ICELL2 is a summation of the cell current signal ICL2 and ICR2. At this moment, a current value of the cell current signal ICELL2 is proportional to $(x1\_2-y1\_2)^2$, in which $(x1\_2-y1\_2)^2$ is a square of a difference between a logic value of the store bit x1_2 and a logic value of the input bit y1_2, and so on. The memory cell MC1_*n* is configured to compare the store bit x1_*n* and the input bit y1_*n* to generate a cell current signal ICELLn. The cell current signal ICELLn is a summation of the cell current signal ICLn and ICRn. At this moment, a current value of the cell current signal ICELLn is proportional to $(x1\_n-y1\_n)^2$, in which $(x1\_n-y1\_n)^2$ is a square of a difference between a logic value of the store bit x1_*n* and a logic value of the input bit y1_*n*.

Then, the memory device 700 is configured to sum the cell current signals ICELL1-ICELLn at the node N71, to generate the bit line signal BL. At this moment, the current value of the bit line signal BL is proportional to a square value $$D_1^2(x, y)$$

of the Euclidean distance $D_1(x, y)$. The Euclidean distance $D_1(x, y)$ represents the Euclidean distance between a data point corresponding to the store bits x1_1-*x*1_*n* and a data point corresponding to the input bits y1_1-*y*1_*n*. The square value $$D_1^2(x, y)$$

can be represented by the following equation (4).

$$D_1^2(x, y) = (x1\_1-y1\_1)^2 + (x1\_2-y1\_2)^2 + \ldots + (x1\_n-y1\_n)^2. \quad \text{equation (4)}$$

As a result, the memory device 700 can perform current summation by wired OR logic operation, to generate the bit line signal BL corresponding to the square value $$D_1^2(x, y).$$

Referring to FIG. 7A to FIG. 7C, the memory device 700 can switch the word line signals from the pass voltage level VPASS to the voltage level corresponding to the input bits, to perform search operations to different data bases. The selected word line signals have search bias levels, and other word line signals have the pass voltage level VPASS.

For example, in the embodiment shown in FIG. 7A, the memory device 700 switches the word line signals WLL96_1-WLL96_*n* and WLR96_1-WLR96_*n* to the search bias levels VGL96_1-VGL96_*n* and VGR96_1-VGR96_*n* corresponding to the input bits y96_1-*y*96_*n*. In the embodiment shown in FIG. 7B, the memory device 700 switches the word line signals WLL94_1-WLL94_*n* and WLR94_1-WLR94_*n* to the search bias levels VGL94_1-VGL94_*n* and VGR94_1-VGR94_*n* corresponding to the input bits y94_1-*y*94_*n*. In the embodiment shown in FIG. 7B, the memory device 700 switches the word line signals WLL1_1-WLL1_*n* and WLR1_1-WLR1_*n* to the search bias levels VGL1_1-VGL1_*n* and VGR1_1-VGR1_*n* corresponding to the input bits y1_1-*y*1_*n*.

Referring to FIG. 7A to FIG. 7C, for operations of different databases in different layers, the memory device 700 adjusts the bit line signal BL to different voltage level, to compensate different body effects. In general, when there are more memory cells between the memory cell performing the search operation and the reference voltage signal VSS, the body effect is larger, such that the voltage level of the bit line signal BL is smaller.

For example, in the embodiment shown in FIG. 7A, in response to 95 memory cells being coupled between the memory cells MC96_1-MC96_*n* and the reference voltage signal VSS (for example, at least the memory cells MC94_1-MC94_*n* and MC1_1-MC1_*n* are coupled between the memory cells MC96_1-MC96_*n* and the reference voltage signal VSS), the body effect is larger, such that the memory device 700 adjusts the bit line signal BL to a voltage level of 0.2 volt.

In the embodiment shown in FIG. 7B, in response to 93 memory cells being coupled between the memory cells MC94_1-MC94_*n* and the reference voltage signal VSS (for example, at least the memory cells MC94_1-MC94_*n* and MC1_1-MC1_*n* are coupled between the memory cells MC94_1-MC94_*n* and the reference voltage signal VSS), the body effect is medium, such that the memory device 700 adjusts the bit line signal BL to a voltage level of 0.5 volt.

In the embodiment shown in FIG. 7C, in response to 0 memory cells being coupled between the memory cells MC1_1-MC1_*n* and the reference voltage signal VSS, the body effect is medium, such that the memory device 700 adjusts the bit line signal BL to a voltage level of 0.7-0.8 volt.

In various embodiments, when switching between search operations of different databases, the memory device 700 correspondingly increases or decreases the voltage level of the bit line signal BL. Top word lines have larger body effect. When the body effect is larger, the voltage level of the bit line signal BL is decreased, to improve Euclidean distance computing accuracy. Bottom word lines have smaller body effect. When the body effect is smaller, the voltage level of the bit line signal BL is increased, to improve Euclidean distance computing accuracy.

For example, when switching from the search operation shown in FIG. 7B to the search operation shown in FIG. 7A, the memory device 700 decreases the voltage level of the bit line signal BL from 0.5 volt to 0.2 volt. When switching from the search operation shown in FIG. 7A to the search operation shown in FIG. 7B, the memory device 700 increases the voltage level of the bit line signal BL from 0.2 volt to 0.5 volt.

Figure 8:
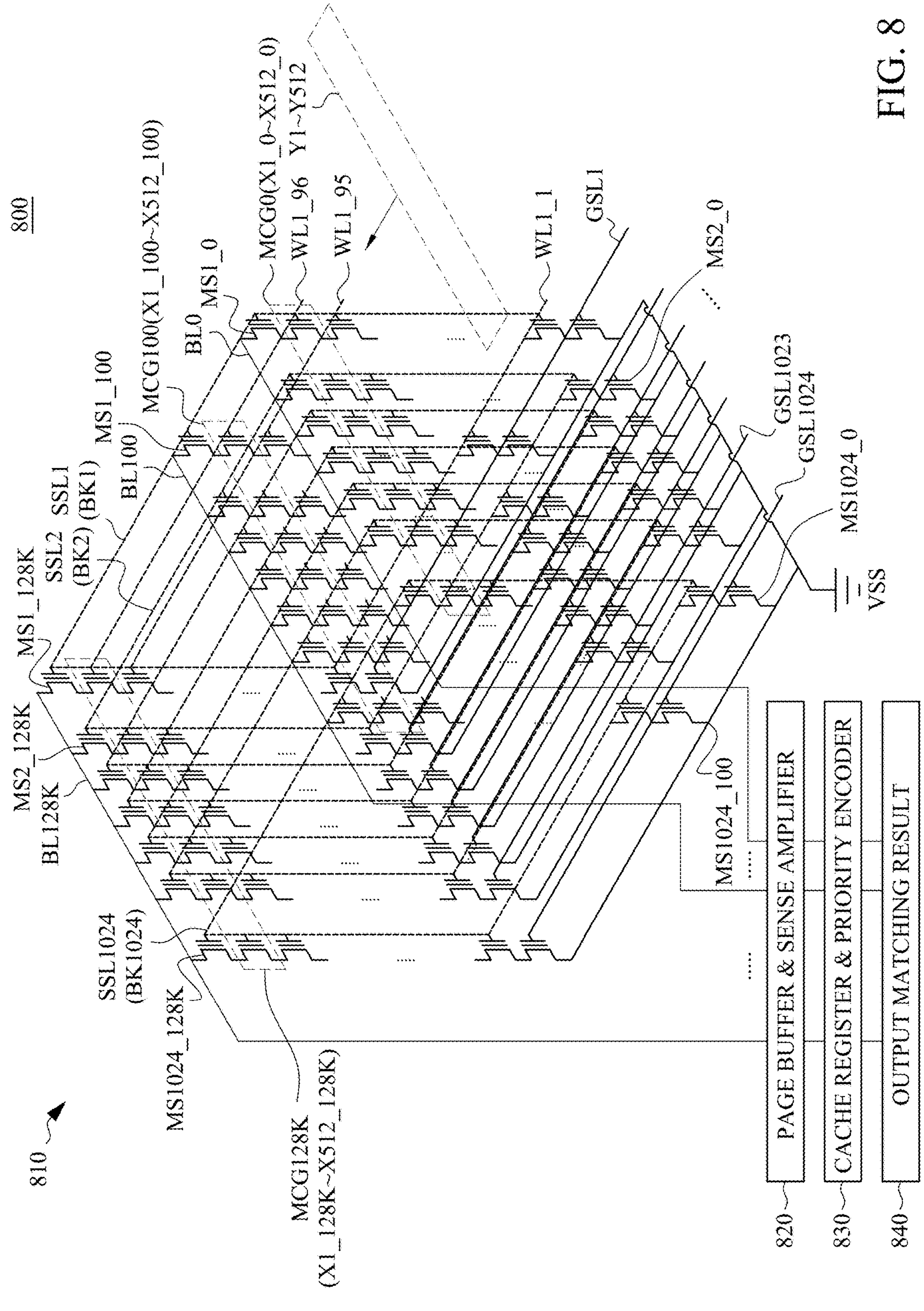
FIG. 8 is a schematic diagram of a memory system illustrated according to some embodiments of present disclosure.

FIG. 8 is a schematic diagram of a memory system 800 illustrated according to some embodiments of present disclosure. As shown in FIG. 8, the memory system 800 includes a memory device 810, a sensing device 820, a register encoding device 830 and an output device 840. In various embodiments, the memory device 810 can be implemented by three-dimensional NAND memory array.

In some embodiments, the memory device 810 is configured to generate bit line signals BL0-BL128K, in which K in 128K represents one thousand. However, the present disclosure is not limited to this. In various embodiments, the memory device 810 can generate various quantities of bit line signals, that is, 128K can be substituted by other positive integers. The sensing device 820 can include a page buffer and a sensing amplifier, and configured to sense the bit line signals BL0-BL128K. The register encoding device 830 can includes cache registers and priority encoders. The output device 840 is configured to output the matching results of the memory device 810.

In some embodiments, the process performed by the register encoding device 830 to the bit line signals includes logic processes of AND logic, OR logic or counting, and also may include combining processes of the three logic processes described above. Referring to FIG. 1 to FIG. 8, the register encoding device 830 can receive sense results from the memory device 100, 700 and/or 810, and controls sequencing (whether serial or parallel) and combines sense results to produce overall search results as the matching results outputted from the output device 840.

As shown in FIG. 8, the memory device 810 includes multiple memory blocks BK1-BK1024. However, the present disclosure is not limited to this. In various embodiments, the memory device 810 can include various quantities of memory blocks, that is, 1024 can be substituted by other positive integers.

In some embodiments, the memory block BK1 is configured to receive a string select line signal SSL1, word line signals WL1_1-WL1_96 and a ground select line signal GSL1. The memory block BK2 is configured to receive a string select line signal SSL2, word line signals WL2_1-WL2_96 and a ground select line signal GSL2, and so on. The memory block BK1024 is configured to receive a string select line signal SSL1024, word line signals WL1024_1-WL1024_96 and a ground select line signal GSL1024.

As shown in FIG. 8, the memory block BK1 includes memory strings MS1_0-MS1_128K. The memory block BK2 includes memory strings MS2_0-MS2_128K, and so on. The memory block BK1024 includes memory strings MS1024_0-MS1024_128K.

The memory strings MS1_0-MS1024_0 includes multiple memory cells, such as a memory cell group MCG0. The memory cell group MCG0 can be configured to store 512 store bits X1_0-X512_0. The word line signals WL1_96-WL1024_96 are configured to carry input bits Y1-Y512. Specifically, the word line signals WL1_96 and WL2_96 are configured to carry the input bit Y1. The word line signals WL3_96 and WL4_96 are configured to carry the input bit Y2, and so on. The word line signals WL1023_96 and WL1024_96 are configured to carry the input bit Y512.

During the search operation, the memory cell group MCG0 is configured to compare the store bits X1_0-X512_0 and the input bits Y1-Y512 to generate the bit line signal BL0. At this moment, a current value of the bit line signal BL0 is proportional to a square of the Euclidean distance between a data point of the store bits X1_0-X512_0 and a data point of the input bits Y1-Y512.

Referring to FIG. 7A and FIG. 8, the memory strings MS1_0-MS1024_0 are an embodiment of the memory strings MSL1-MSLn and MSR1-MSRn. The memory cell group MCG0 is an embodiment of the memory cells MC96_1-MC96_*n*. The store bits X1_0-X512_0 correspond to the store bits x96_1-*x*96_*n*. The input bits Y1-Y512 correspond to the input bits y96_1-*y*96_*n*. The word line signals WL1_96-WL1024_96 correspond to the word line signals WLL96_1-WLL_*n* and WLR96_1-WLR_*n*. The bit line signal BL0 corresponds to the bit line signal BL. Therefore, some descriptions are not repeated for brevity.

Similarly, memory strings MS1_100-MS1024_100 includes multiple memory cells, such as a memory cell group MCG100. The memory cell group MCG100 can be configured to store 512 store bits X1_100-X512_100. During the search operation, the memory cell group MCG0 is configured to compare the store bits X1_100-X512_100 and the input bits Y1-Y512 to generate the bit line signal BL100. At this moment, a current value of the bit line signal BL100 is proportional to a square of the Euclidean distance between a data point of the store bits X1_100-X512_100 and a data point of the input bits Y1-Y512.

Referring to FIG. 7A and FIG. 8, the memory strings MS1_100-MS1024_100 are an embodiment of the memory strings MSL1-MSLn and MSR1-MSRn. The memory cell group MCG100 is an embodiment of the memory cells MC96_1-MC96_*n*. The store bits X1_100-X512_100 correspond to the store bits x96_1-*x*96_*n*. The input bits Y1-Y512 correspond to the input bits y96_1-*y*96_*n*. The word line signals WL1_96-WL1024_96 correspond to the word line signals WLL96_1-WLL_*n* and WLR96_1-WLR_*n*. The bit line signal BL100 corresponds to the bit line signal BL. Therefore, some descriptions are not repeated for brevity.

Similarly, memory strings MS1_128K-MS1024_128K includes multiple memory cells, such as a memory cell group MCG128K. The memory cell group MCG128K can be configured to store 512 store bits X1_128K-X512_128K. During the search operation, the memory cell group MCG0 is configured to compare the store bits X1_128K-X512_128K and the input bits Y1-Y512 to generate the bit line signal BL128K. At this moment, a current value of the bit line signal BL128K is proportional to a square of the Euclidean distance between a data point of the store bits X1_128K-X512_128K and a data point of the input bits Y1-Y512.

Referring to FIG. 7A and FIG. 8, the memory strings MS1_128K-MS1024_128K are an embodiment of the memory strings MSL1-MSLn and MSR1-MSRn. The memory cell group MCG128K is an embodiment of the memory cells MC96_1-MC96_*n*. The store bits X1_128K-X512_128K correspond to the store bits x96_1-*x*96_*n*. The input bits Y1-Y512 correspond to the input bits y96_1-*y*96_*n*. The word line signals WL1_96-WL1024_96 correspond to the word line signals WLL96_1-WLL_*n* and WLR96_1-WLR_*n*. The bit line signal BL128K corresponds to the bit line signal BL. Therefore, some descriptions are not repeated for brevity.

In summary, the 128K data points corresponding to the bit line signals can be compared with the data point of the input bits Y1-Y512 in one read cycle. Different databases can be stored in various memory layers as the store bits, and perform the search operations with input bits carried by other word line signals.

In the embodiment shown in FIG. 8, a space dimension of the data bits of the store bits and the input bits is 512, in which 512 is a half of the memory block number 1024. Alternatively stated, the space dimension is defined by the memory block number. In various embodiments, for an positive integer m, a space dimension of m/2 can be implemented by opening m blocks.

In some embodiments, a square of the Euclidean distance between a data point of the store bits and a data point of the input bits can be represented by the bit line signal generated with summation of the current signals generated by the memory strings, and can be detected by sensing amplifiers (SA) in the sensing device 820. The root function performed to the square of the Euclidean distance also can be performed by the sensing amplifiers.

In some embodiments, the sensing amplifiers can define the current criteria to filter all data points, and only output highly similar data points to central processing unit (CPU) and/or graphic processing unit (GPU).

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A memory device, comprising:

a first memory string comprising a first switch element and configured to generate a first cell current signal; and a second memory string comprising a second switch element and configured to generate a second cell current signal, wherein the first switch element and the second switch element are configured to operate as a first memory cell storing a first store bit, a control terminal of the first switch element and a control terminal of the second switch element are configured to receive a first word line signal and a second word line signal, respectively, the first word line signal and the second word line signal are configured to carry a first input bit, and a summation of a current value of the first cell current signal and a current value of the second cell current signal is proportional to a square of a difference between a logic value of the first store bit and a logic value of the first input bit, wherein when the first store bit has a first logic value, the first switch element has a first threshold voltage level, when the first store bit has a second logic value, the first switch element has a second threshold voltage level, when the first input bit has the first logic value, the first word line signal has a first voltage level, when the first input bit has the second logic value, the first word line signal has a second voltage level, and a difference between the first threshold voltage level and the second threshold voltage level is equal to a difference between the first voltage level and the second voltage level, wherein when the first store bit has the first logic value, the first switch element has a third threshold voltage level, when the first store bit has the second logic value, the first switch element has a fourth threshold voltage level, when the first input bit has the first logic value, the first word line signal has a third voltage level, when the first input bit has the second logic value, the first word line signal has a fourth voltage level, and a difference between the third threshold voltage level and the fourth threshold voltage level is equal to a difference between the third voltage level and the fourth voltage level.

2. The memory device of claim 1, wherein the difference between the third threshold voltage level and the fourth threshold voltage level is equal to the difference between the first threshold voltage level and the second threshold voltage level.

3. The memory device of claim 1, wherein when the first store bit has a third logic value, the first switch element and the second switch element have the third threshold voltage level and the first threshold voltage level, respectively, and a difference between the first threshold voltage level and the third threshold voltage level is equal to the difference between the first threshold voltage level and the second threshold voltage level multiplied by a difference between the first logic value and the third logic value.

4. The memory device of claim 3, wherein when the first input bit has the third logic value, the first word line signal and the second word line signal have the third voltage level and the first voltage level, respectively.

5. The memory device of claim 3, wherein when the first store bit and the first input bit have the first logic value and the second logic value, respectively, the second cell current signal has a first current value, when the first store bit and the first input bit have the first logic value and the third logic value, respectively, the second cell current signal has a second current value, the second current value is equal to the first current value multiplied by a square of the difference between the first logic value and the third logic value.

6. The memory device of claim 5, wherein when the first store bit and the first input bit have the third logic value and the first logic value, respectively, the first cell current signal has the second current value.

7. The memory device of claim 1, wherein when each of the first store bit and the first input bit has the first logic value, each of the first cell current signal and the second cell current signal has a first current value, when the first store bit and the first input bit have the first logic value and the second logic value, respectively, the first cell current signal and the second cell current signal have the first current value and a second current value, respectively, and the second current value is larger than the first current value.

8. The memory device of claim 7, wherein when the first store bit and the first input bit have the first logic value and a third logic value, respectively, the first cell current signal and the second cell current signal have the first current value and a third current value, respectively, the third current value is equal to the first current value multiplied by four, and a difference between the first logic value and the second logic value is equal to a difference between the second logic value and the third logic value.

9. The memory device of claim 8, wherein when the first store bit and the first input bit have the first logic value and a fourth logic value, respectively, the first cell current signal and the second cell current signal have the first current value and a fourth current value, respectively, the third current value is equal to the first current value multiplied by nine, and a difference between the third logic value and the fourth logic value is equal to a difference between the second logic value and the third logic value.

* * * * *